(12) United States Patent
Yamagami

(10) Patent No.: US 12,412,812 B2
(45) Date of Patent: *Sep. 9, 2025

(54) SEMICONDUCTOR PACKAGE WITH PLURALITY OF LEADS AND SEALING RESIN

(71) Applicant: ROHM CO., LTD., Kyoto (JP)

(72) Inventor: Mamoru Yamagami, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/485,318

(22) Filed: Oct. 12, 2023

(65) Prior Publication Data

US 2024/0038635 A1   Feb. 1, 2024

Related U.S. Application Data

(63) Continuation of application No. 17/826,975, filed on May 27, 2022, now Pat. No. 11,908,777, which is a
(Continued)

(30) Foreign Application Priority Data

Feb. 15, 2016 (JP) ................. 2016-026107

(51) Int. Cl.
  *H01L 23/495* (2006.01)
  *H01L 21/48* (2006.01)
  (Continued)

(52) U.S. Cl.
  CPC .... *H01L 23/49513* (2013.01); *H01L 21/4825* (2013.01); *H01L 21/4842* (2013.01);
  (Continued)

(58) Field of Classification Search
  CPC ........... H01L 23/49513; H01L 21/4825; H01L 23/4951
  See application file for complete search history.

(56) References Cited

U.S. PATENT DOCUMENTS 8,163,604 B2 * 4/2012 Ong .................. H01L 23/49582
                                                                438/114
8,822,273 B2   9/2014 Kuo et al.
(Continued)

FOREIGN PATENT DOCUMENTS

CN    206225352 U  *  6/2017  ......... H01L 21/4825
JP    H11-26643 A       1/1999
(Continued)

OTHER PUBLICATIONS

Japanese Office Action issued Mar. 14, 2024 in corresponding Japanese Patent Application No. 2022-211272, 8 pages.
(Continued)

*Primary Examiner* — Mamadou L Diallo
(74) *Attorney, Agent, or Firm* — XSENSUS LLP

(57) ABSTRACT

A semiconductor device includes a semiconductor chip, a plurality of leads that each includes a lead body portion which has a mounting portion which includes an upper surface whereon a semiconductor chip is bonded, and a lead connecting portion for external connection which projects downward from a lower surface of the lead body portion, a first sealing resin that seals a space that is defined by each lead body portion and each lead connecting portion of the plurality of leads in a region below the upper surface of each lead body portion of the plurality of leads, and a second sealing resin that seals the semiconductor chip in a region above the upper surface of each lead body portion of the plurality of leads.

32 Claims, 25 Drawing Sheets

Related U.S. Application Data continuation of application No. 15/428,421, filed on Feb. 9, 2017, now Pat. No. 11,373,935.

(51) Int. Cl.
  *H01L 21/52* (2006.01)
  *H01L 21/56* (2006.01)
  *H01L 21/78* (2006.01)
  *H01L 23/31* (2006.01)

(52) U.S. Cl.
  CPC ............ *H01L 21/52* (2013.01); *H01L 21/565* (2013.01); *H01L 21/78* (2013.01); *H01L 23/3142* (2013.01); *H01L 23/49524* (2013.01); *H01L 23/49548* (2013.01); *H01L 23/49582* (2013.01); *H01L 21/561* (2013.01); *H01L 23/3121* (2013.01); *H01L 23/4951* (2013.01); *H01L 23/49541* (2013.01); *H01L 23/49575* (2013.01); *H01L 2224/16245* (2013.01); *H01L 2224/32245* (2013.01); *H01L 2224/48247* (2013.01); *H01L 2224/73265* (2013.01); *H01L 2224/97* (2013.01); *H01L 2924/181* (2013.01); *H01L 2924/19105* (2013.01)

(56) References Cited

U.S. PATENT DOCUMENTS

| | | | |
|---|---|---|---|
| 9,478,517 B2 | 10/2016 | Paek et al. | |
| 9,613,829 B1 | 4/2017 | Lee et al. | |
| 9,741,642 B1 | 8/2017 | Nondhasitthichai et al. | |
| 10,515,878 B1 | 12/2019 | Nondhasitthichai et al. | |
| 2001/0040286 A1 | 11/2001 | Fujimoto et al. | |
| 2002/0020907 A1 | 2/2002 | Seo et al. | |
| 2003/0001244 A1 | 1/2003 | Araki et al. | |
| 2003/0001252 A1 | 1/2003 | Ku et al. | |
| 2005/0082690 A1 | 4/2005 | Hayashi et al. | |
| 2005/0104174 A1* | 5/2005 | Kishimoto | H01L 21/4842 438/111 |
| 2005/0116327 A1* | 6/2005 | Danno | H01L 23/49503 257/710 |
| 2006/0081967 A1 | 4/2006 | Ha et al. | |
| 2006/0192295 A1 | 8/2006 | Lee et al. | |
| 2006/0237824 A1 | 10/2006 | Lee et al. | |
| 2006/0249830 A1* | 11/2006 | Shim | H01L 24/29 257/E23.036 |
| 2010/0052131 A1 | 3/2010 | Tay et al. | |
| 2010/0224971 A1 | 9/2010 | Li | |
| 2011/0074016 A1* | 3/2011 | Narita | H01L 21/4821 257/737 |
| 2011/0147931 A1 | 6/2011 | Nondhasitthichai et al. | |
| 2011/0244629 A1 | 10/2011 | Gong et al. | |
| 2012/0049335 A1 | 3/2012 | Sirinorakul et al. | |
| 2012/0153447 A1 | 6/2012 | Jiang | |
| 2012/0313131 A1 | 12/2012 | Oda et al. | |
| 2012/0313234 A1 | 12/2012 | Shen | |
| 2013/0020688 A1* | 1/2013 | Pan | H01L 23/3107 257/676 |
| 2013/0221509 A1 | 8/2013 | Oda et al. | |
| 2013/0280865 A1* | 10/2013 | Shen | H01L 21/56 438/123 |
| 2014/0103510 A1* | 4/2014 | Andou | H01L 23/49551 257/676 |
| 2014/0319663 A1 | 10/2014 | Shibasaki et al. | |
| 2014/0353809 A1* | 12/2014 | Shimizu | H01L 24/97 257/676 |
| 2014/0361444 A1* | 12/2014 | Narita | H01L 23/49582 257/778 |
| 2015/0049421 A1 | 2/2015 | Paek et al. | |
| 2015/0318247 A1 | 11/2015 | Kunimitsu et al. | |
| 2015/0325502 A1* | 11/2015 | Andou | H01L 24/89 438/123 |
| 2016/0043020 A1 | 2/2016 | Xia et al. | |
| 2016/0086881 A1 | 3/2016 | Standing | |
| 2016/0172316 A1* | 6/2016 | Taguchi | H01L 21/565 249/96 |
| 2016/0247748 A1 | 8/2016 | Kinzer | |
| 2016/0260656 A1 | 9/2016 | Hwang et al. | |
| 2016/0329269 A1 | 11/2016 | Shih | |
| 2017/0301643 A1* | 10/2017 | Danno | H01L 23/49503 |
| 2017/0330809 A1 | 11/2017 | Kajihara et al. | |
| 2018/0005920 A1 | 1/2018 | Kajihara et al. | |
| 2018/0076371 A1* | 3/2018 | Kobayakawa | H01L 23/488 |

FOREIGN PATENT DOCUMENTS

| | | | |
|---|---|---|---|
| JP | 2001-332675 | A | 11/2001 |
| JP | 2002-110849 | A | 4/2002 |
| JP | 2003-258187 | A | 9/2003 |
| JP | 2005-209770 | A | 8/2005 |
| JP | 2005-260271 | A | 9/2005 |
| JP | 2005-277434 | A | 10/2005 |
| JP | 2007-173712 | A | 7/2007 |
| JP | 2008-112961 | A | 5/2008 |
| JP | 2011-171768 | A | 9/2011 |
| JP | 2012-164877 | A | 8/2012 |
| JP | 2012-182392 | A | 9/2012 |
| JP | 2015-073120 | A | 4/2015 |

OTHER PUBLICATIONS

Decision of Dismissal of Amendment of JP Patent Application No. JP 2016-026107 (related application); Masayuki Hirabayashi; Feb. 25, 2021; 17 pages.
Japanese Patent Office: Notice of Reasons for Refusal of JP Patent Application No. 2021-083933 (related application); Shoji, Kazutaka; Apr. 14, 2022; 9 pages.
Japanese Patent Office: Office Action of JP 2016-026107 (related application); Nov. 14, 2019; 14 pages.
Japanese Patent Office: Notification of Reasons for Refusal of JP Patent Application No. JP 2016-026107 (related application); Masayuki Hirabayashi; Jul. 2, 2020; 14 pages.
Japanese Patent Office: Decision of Refusal of Japanese Patent Application No. 2021-083933 (related application); Shoji, Kazutaka; Oct. 20, 2022; 8 pages.
Japanese Office Action issued Oct. 26, 2023 in Japanese Patent Application No. 2022-211272 (with machine-generated English translation), 6 pages.
Japanese Decision of Refusal issued Aug. 22, 2024 in corresponding Japanese Divisional Patent Application No. 2022-211272, 3 pages.
Japanese Decision of Dismissal of Amendment issued Aug. 22, 2024 in corresponding Japanese Divisional Patent Application No. 2022-211272, 9 pages.

* cited by examiner

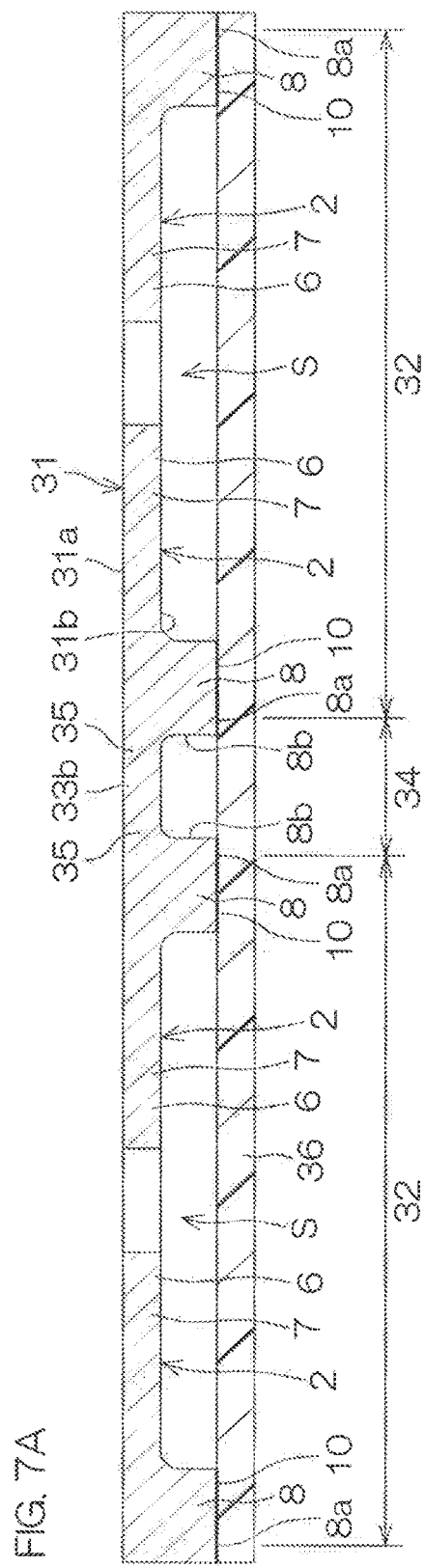

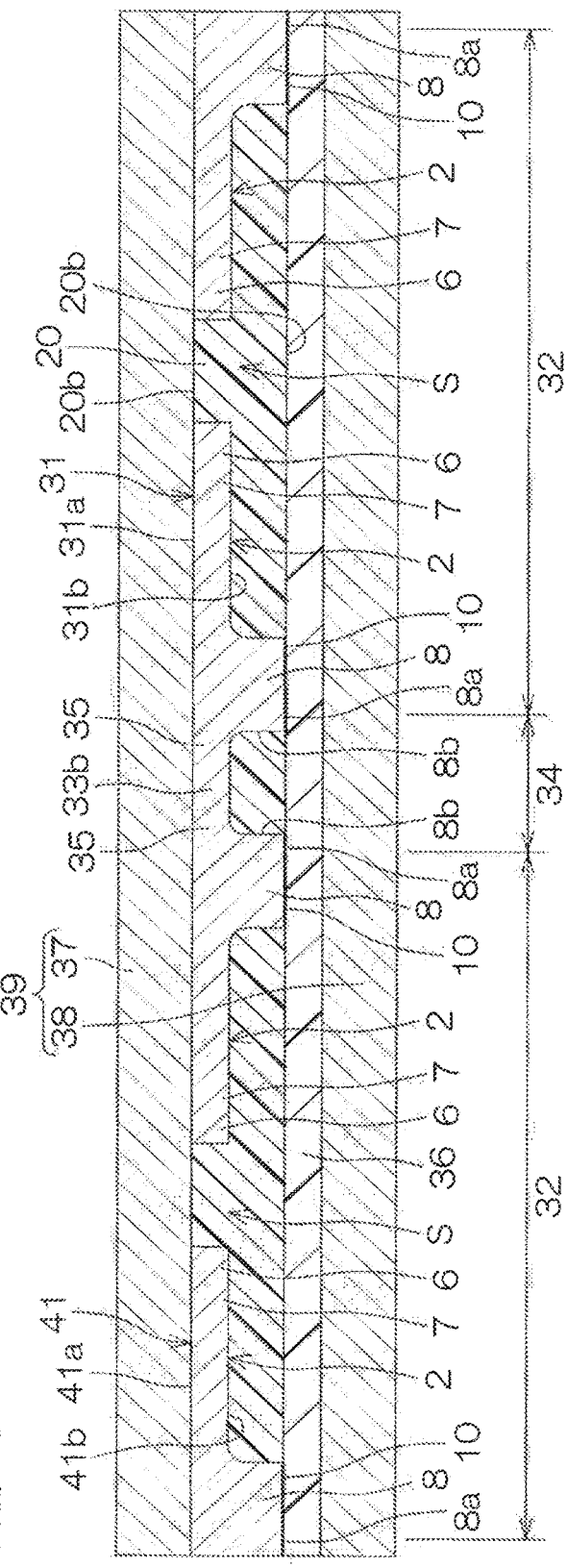

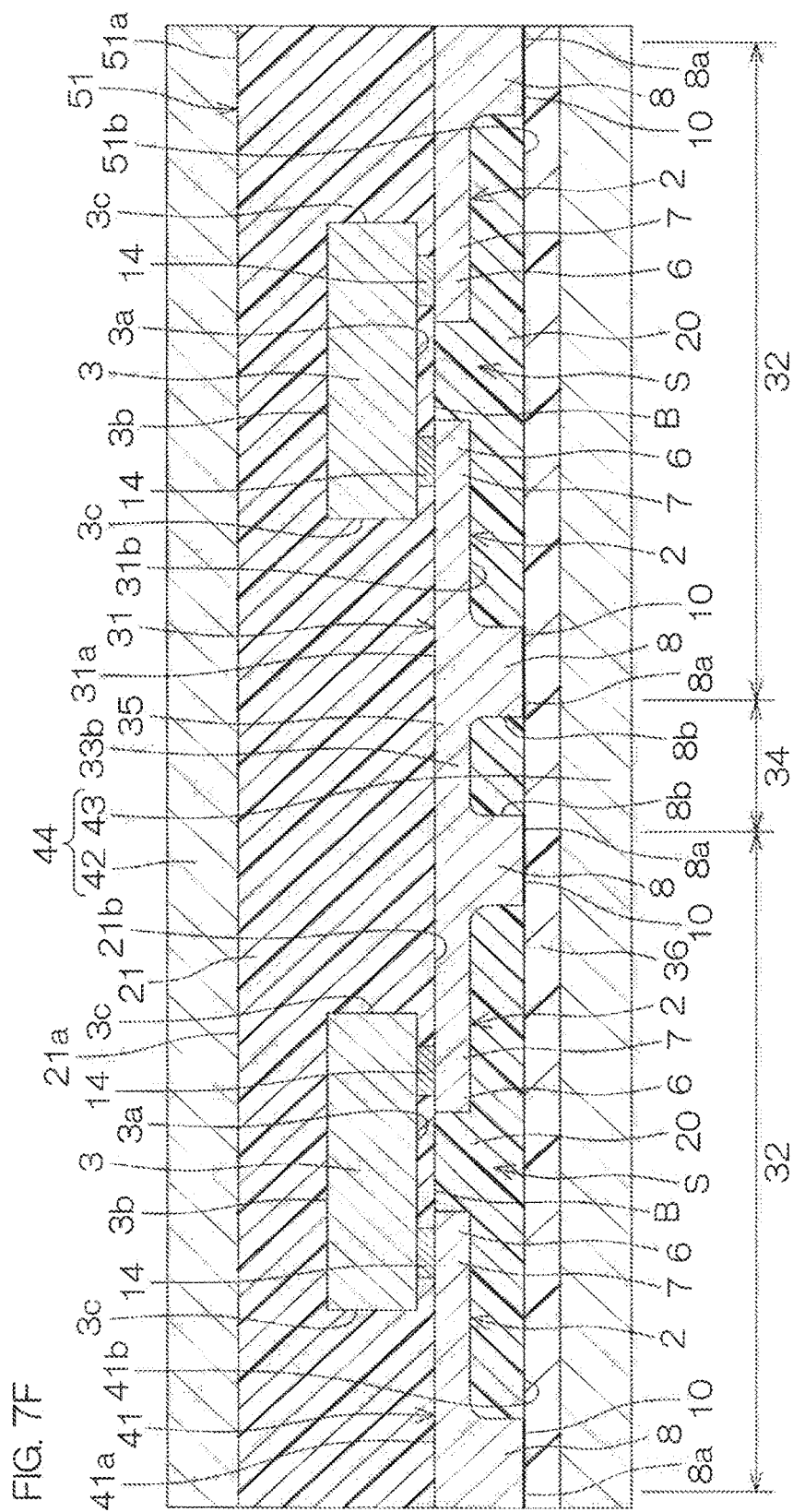

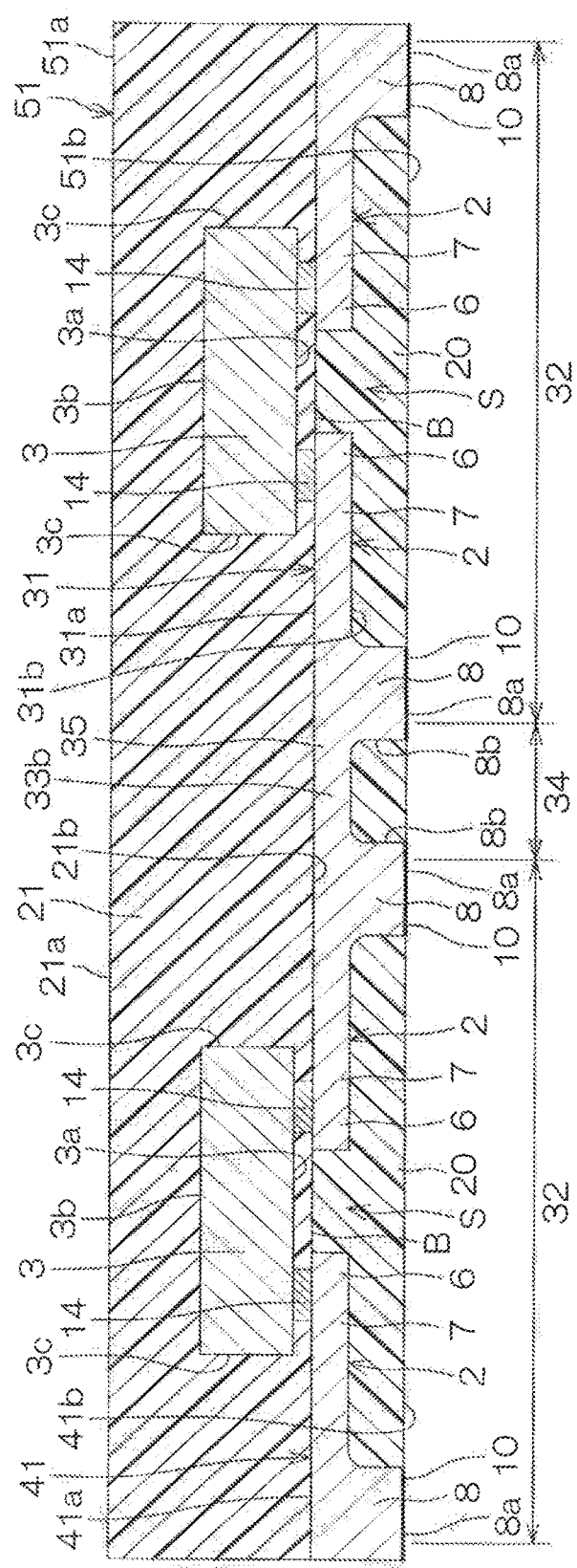

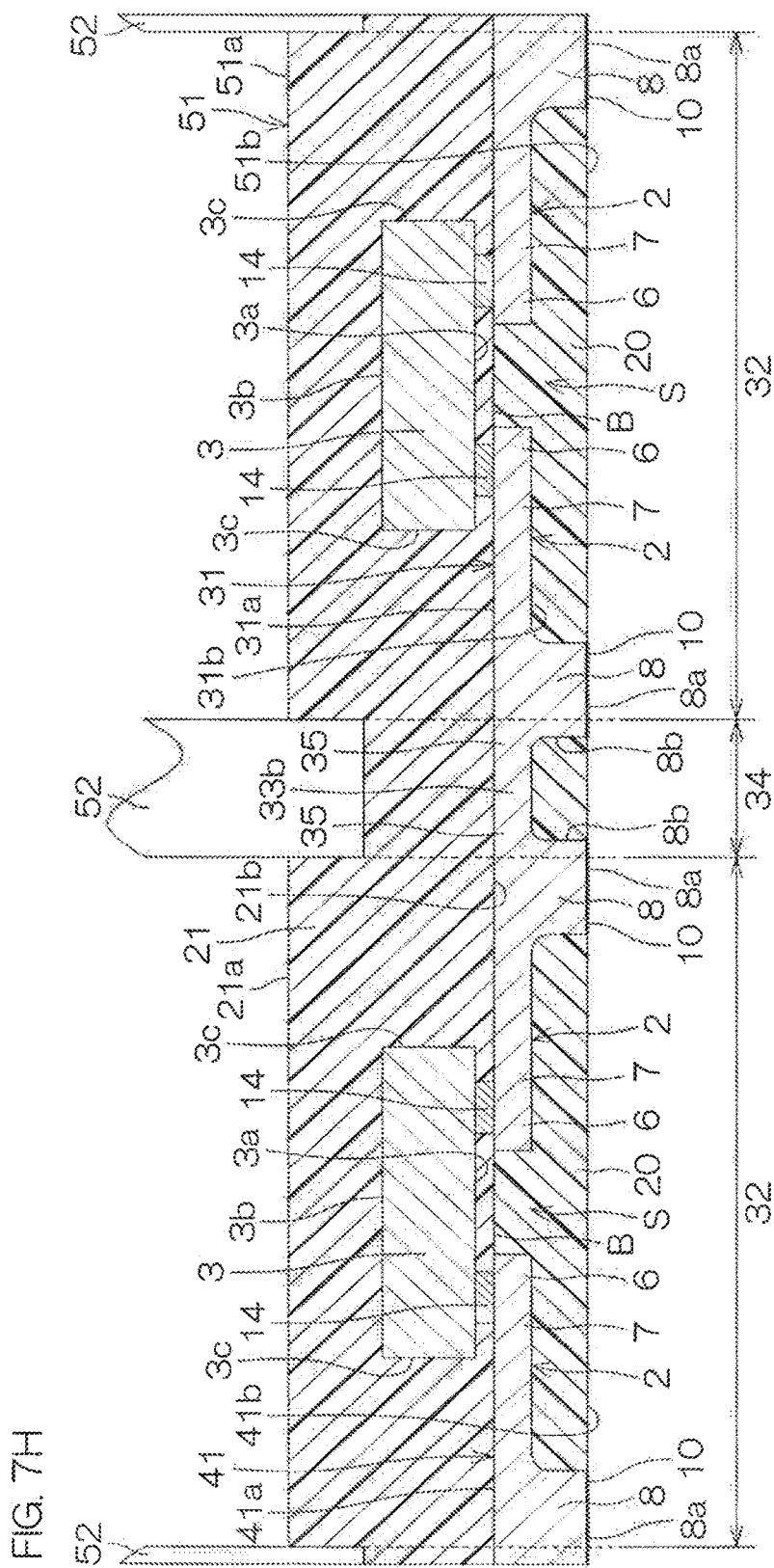

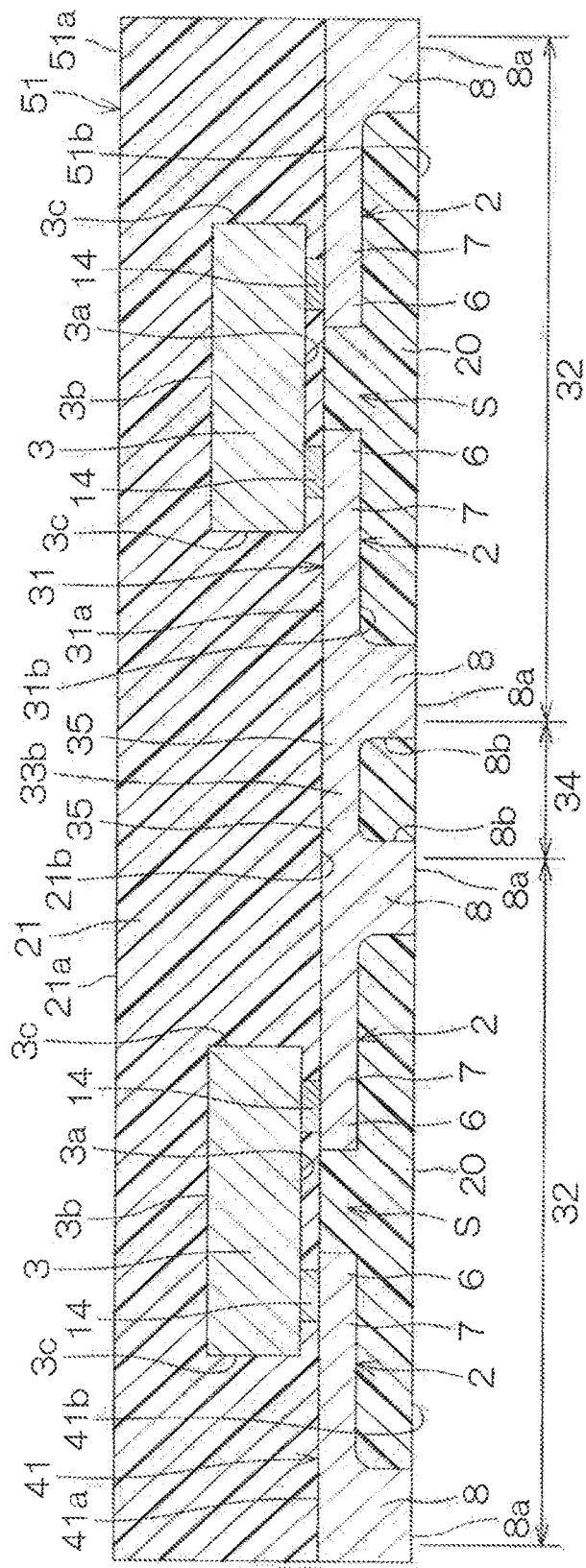

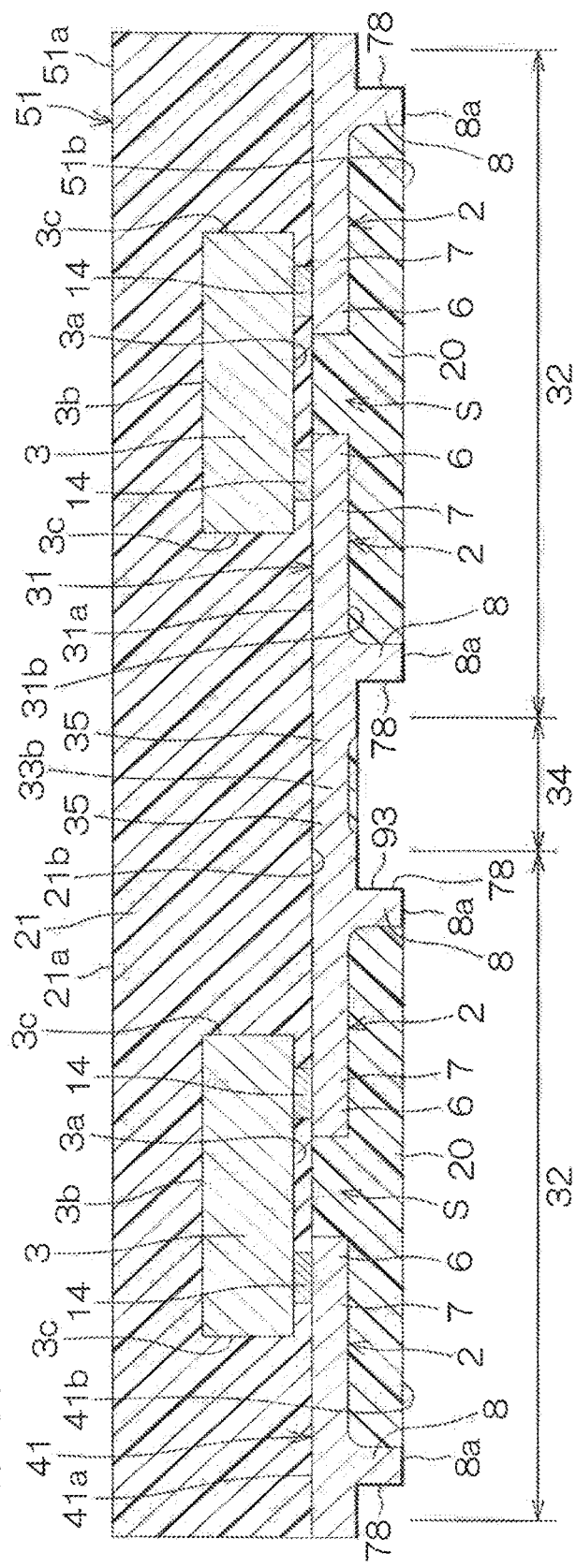

SEMICONDUCTOR PACKAGE WITH PLURALITY OF LEADS AND SEALING RESIN

CROSS-REFERENCE TO RELATED APPLICATIONS

This application is a continuation of U.S. application Ser. No. 17/826,975, filed on May 27, 2022 which is a continuation of U.S. application Ser. No. 15/428,421, filed on Feb. 9, 2017 (now U.S. Pat. No. 11,373,935) entitled SEMICONDUCTOR PACKAGE WITH PLURALITY OF LEADS AND SEALING RESIN, which claims the benefit of priority of Japanese application No. 2016-026107, filed on Feb. 15, 2016. The specifications of which are incorporated by reference herein in their entirety.

BACKGROUND OF THE INVENTION

1. Field of the Invention

The present invention relates to a semiconductor device that has a structure in which a plurality of leads and a semiconductor chip are sealed by a sealing resin, and a method for manufacturing a semiconductor device that has such a structure. The present invention further relates to a lead frame intermediate body for use in a manufacture of a semiconductor device that has such a structure.

2. Description of the Related Art

JP 2012182392 discloses a semiconductor device that includes a semiconductor chip, a die pad whereon the semiconductor chip is arranged, a plurality of terminal parts (leads) arranged around the die pad and connected to the semiconductor chip, and a sealing resin that seals the semiconductor chip, the die pad, and the plurality of terminal parts.

SUMMARY OF THE INVENTION

A semiconductor device according to the present invention includes a semiconductor chip, a plurality of leads that each includes a lead body portion which has a mounting portion which includes an upper surface whereon a semiconductor chip is bonded, and a lead connecting portion for external connection which projects downward from a lower surface of the lead body portion; a first sealing resin that seals a space that is defined by each lead body portion and each lead connecting portion of the plurality of leads in a region below the upper surface of each lead body portion of the plurality of leads, and a second sealing resin that seals the semiconductor chip in a region above the upper surface of each lead body portion of the plurality of leads.

A lead frame intermediate body according to the present invention includes a lead frame that has a plurality of leads that each includes a lead body portion which has a mounting portion which includes an upper surface whereon a semiconductor chip can be bonded, and a lead connecting portion for external connection which projects downward from a lower surface of the lead body portion, and a frame member coupled to each lead body portion of the plurality of leads via a support portion which retains the plurality of leads, and a sealing resin that seals a space that is defined by each lead body portion and each lead connecting portion of the plurality of leads in a region below the upper surface of each lead body portion of the plurality of leads to thereby fix the plurality of leads to the frame member.

A method for manufacturing a semiconductor device according to the present invention includes a step of preparing a lead frame that has a plurality of leads that each includes a lead body portion which has a mounting portion which includes an upper surface whereon a semiconductor chip is bonded and a lead connecting portion for external connection which projects downward from a lower surface of the lead body portion, and a frame member coupled to each lead body portion of the plurality of leads via a support portion which retains the plurality of leads; a step of forming a lead frame intermediate body with the plurality of leads fixed to the frame member via a first sealing resin by supplying the first sealing resin in a region below the upper surface of each lead body portion of the plurality of leads so as to seal a space that is defined by each lead body portion and each lead connecting portion of the plurality of leads; and a step of mounting a semiconductor chip onto the mounting portion of the plurality of leads, which is exposed from the lead frame intermediate body.

The above-described objects, features, and the advantages and/or other objects, features, and the advantages according to the present invention will be made apparent from the following description of embodiments taken in conjunction with the accompanying drawings.

BRIEF DESCRIPTION OF THE DRAWINGS

FIGS. 7A to 7H are views showing a method for manufacturing the semiconductor device shown in FIG. 1, showing cross-sectional views along the line A-A shown in FIG. 6.

FIGS. 13A to 13D are cross-sectional views showing a method for manufacturing the semiconductor device shown in FIG. 10.

DETAILED DESCRIPTION OF THE PREFERRED EMBODIMENTS

Figure 1:
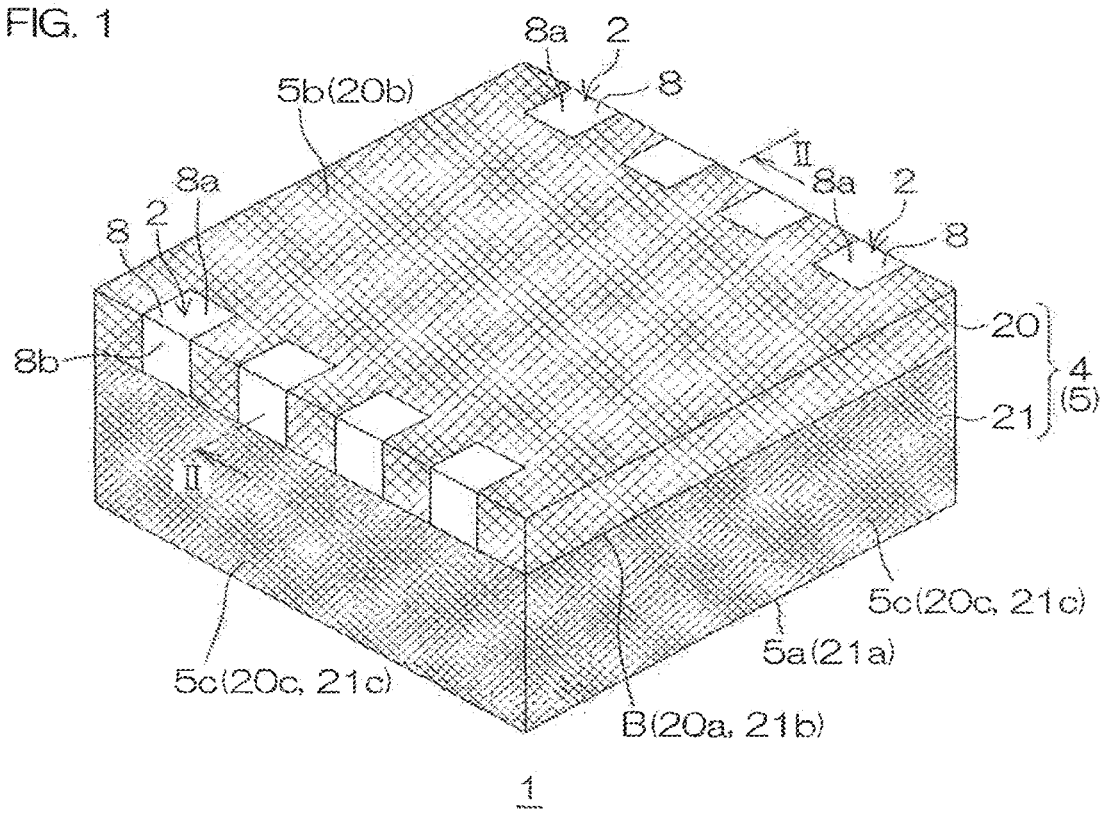
FIG. 1 is a perspective view of a semiconductor device according to a first embodiment of the present invention as viewed from a lower surface side.

In recent years, in response to a request for the miniaturization of a semiconductor device, an effort has been made to achieve the miniaturization and thinning of a lead constituting a part of a semiconductor device. In a step of manufacturing a semiconductor device, a lead frame that includes a plurality of leads and a frame member which supports the plurality of leads is prepared. The lead frame generally has a larger area than the area of a single semiconductor chip, in plan view.

The lead frame that has such a structure is susceptible to deformation by external force or the like, thereby making it difficult to handle the lead frame. Further, a lead frame that has such a structure may also be subjected to deformation by application of weight when mounting a semiconductor chip onto the lead frame. These problems can result in substantial reductions in yield of the semiconductor device.

Therefore, an embodiment according to the present invention is to provide a method for manufacturing a semiconductor device capable of suppressing the reductions in yield due to the deformation of a lead frame, and a semiconductor device manufactured by such a manufacturing method.

Further, an embodiment of the present invention provides a lead frame intermediate body easy to handle, and capable of contributing to the improvement of the yield.

A method for manufacturing a semiconductor device according to an embodiment includes a step of preparing a lead frame that has a plurality of leads that each includes a lead body portion which has a mounting portion which includes an upper surface whereon a semiconductor chip is bonded and a lead connecting portion for external connection which projects downward from a lower surface of the lead body portion, and a frame member coupled to each lead body portion of the plurality of leads via a support portion which retains the plurality of leads, a step of forming a lead frame intermediate body with the plurality of leads fixed to the frame member via a first sealing resin by supplying the first sealing resin in a region below the upper surface of each lead body portion of the plurality of leads so as to seal a space that is defined by each lead body portion and each lead connecting portion of the plurality of leads, and a step of mounting a semiconductor chip onto the mounting portion of the plurality of leads, which is exposed from the lead frame intermediate body.

According to the method for manufacturing a semiconductor device, the sealing step by the first sealing resin is performed before the mounting step of the semiconductor chip. The first sealing resin seals the space that is defined by each lead body portion and each lead connecting portion of the plurality of leads in a region below the upper surface of each lead body portion of the plurality of leads. By performing this step, the lead frame and the first sealing resin are integrated to thereby form a lead frame intermediate body.

According to the lead frame intermediate body, the plurality of leads is fixed to the frame member by the first sealing resin so that the plurality of leads can be prevented from being deformed due to an external force or the like.

Further, in the mounting step of the semiconductor chip, the semiconductor chip can be bonded onto the plurality of leads fixed to the frame member by the first sealing resin. Thereby, the plurality of leads can be prevented from being deformed due to application of weight during the mounting step. Therefore, the connection failure between the semiconductor chip and the plurality of leads can be suppressed, so that the reductions in yield can be suppressed.

A semiconductor device according to an embodiment includes a semiconductor chip, a plurality of leads that each includes a lead body portion which has a mounting portion which includes an upper surface whereon a semiconductor chip is bonded, and a lead connecting portion for external connection which projects downward from a lower surface of the lead body portion, a first sealing resin that seals a space that is defined by each lead body portion and each lead connecting portion of the plurality of leads in a region below the upper surface of each lead body portion of the plurality of leads, and a second sealing resin that seals the semiconductor chip in a region above the upper surface of each lead body portion of the plurality of leads.

The semiconductor device, for example, can be manufactured by making use of the above-described method for manufacturing a semiconductor device. Therefore, the semiconductor device that has favorable electrical connection between the semiconductor chip and the plurality of leads can be produced in high yield.

A lead frame intermediate body according to an embodiment includes a lead frame that has a plurality of leads that each includes a lead body portion which has a mounting portion which includes an upper surface whereon a semiconductor chip can be bonded and a lead connecting portion for external connection which projects downward from a lower surface of the lead body portion, and a frame member coupled to each lead body portion of the plurality of leads via a support portion which retains the plurality of leads, and a sealing resin that seals a space that is defined by each lead body portion and each lead connecting portion of the plurality of leads in a region below the upper surface of each lead body portion of the plurality of leads to thereby fix the plurality of leads to the frame member.

The lead frame intermediate body can be manufactured by making use of the above-described method for manufacturing a semiconductor device. According to the lead frame intermediate body, the plurality of leads is fixed to the frame member by the sealing resin so that the plurality of leads can be prevented from being deformed due to an external force or the like.

Further, according to the lead frame intermediate body, a semiconductor chip can be bonded onto the plurality of leads fixed to the frame member by the sealing resin, so that the plurality of leads can be prevented from being deformed due to application of weight during the mounting step. Therefore, the connection failure between a semiconductor chip and the plurality of leads can be suppressed. Thereby, it is possible to provide a lead frame intermediate body easy to handle, and capable of contributing to the improvement of the yield.

Hereinafter, an embodiment according to the present invention is described in detail with reference to the accompanying drawings.

First Embodiment

Figure 2:
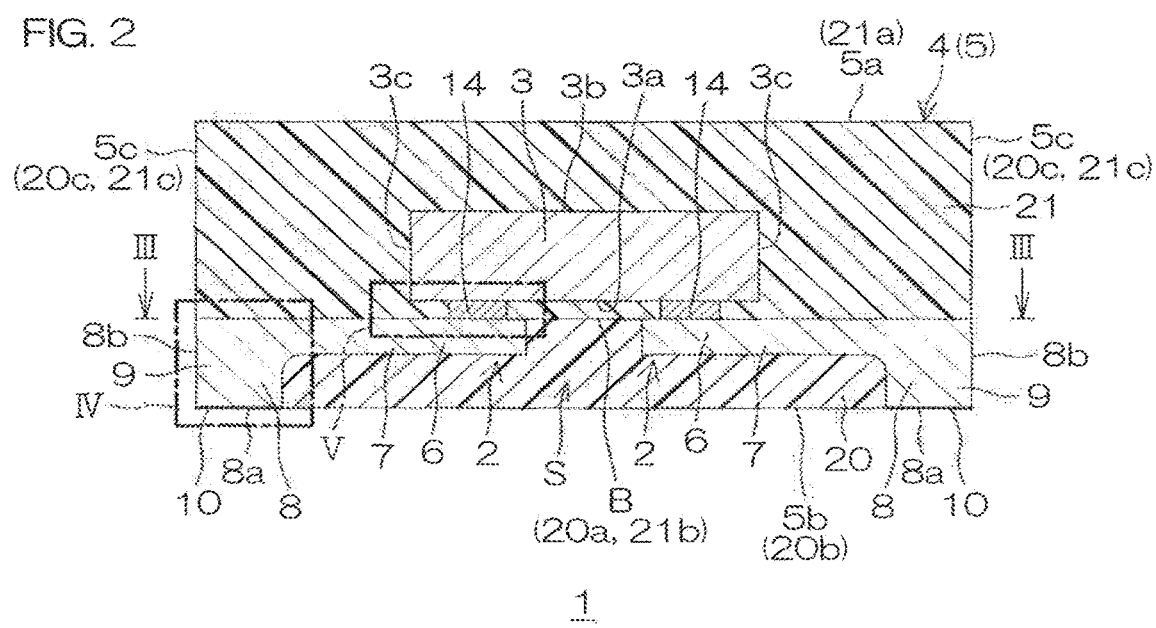
FIG. 2 is a cross-sectional view taken along the line II-II shown in FIG. 1.

FIG. 1 is a perspective view of a semiconductor device 1 according to a first embodiment of the present invention as viewed from a lower surface side. FIG. 2 is a cross-sectional view taken along the line II-II shown in FIG. 1. FIG. 2 shows a state in which the semiconductor device 1 shown in FIG. 1 is turned upside down.

Figure 3:
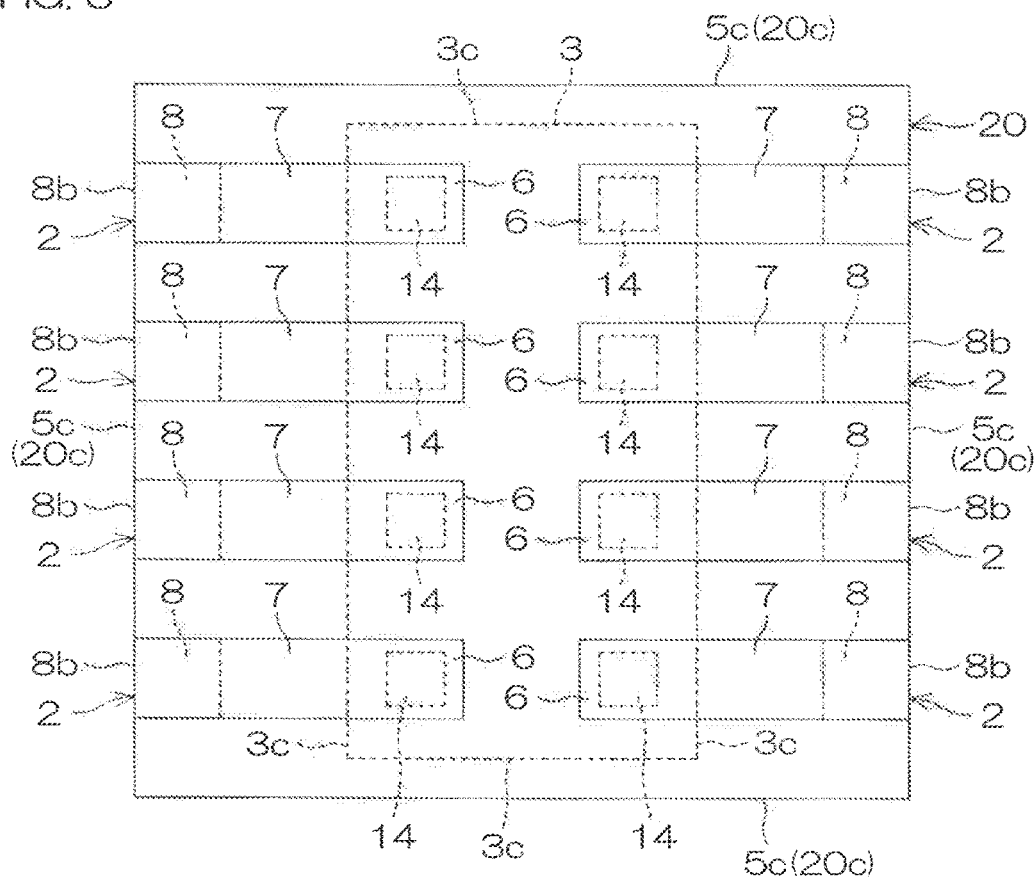
FIG. 3 is a plan view showing a state in which the upper structure above the line III-III shown in FIG. 2 is removed.
Figure 4:
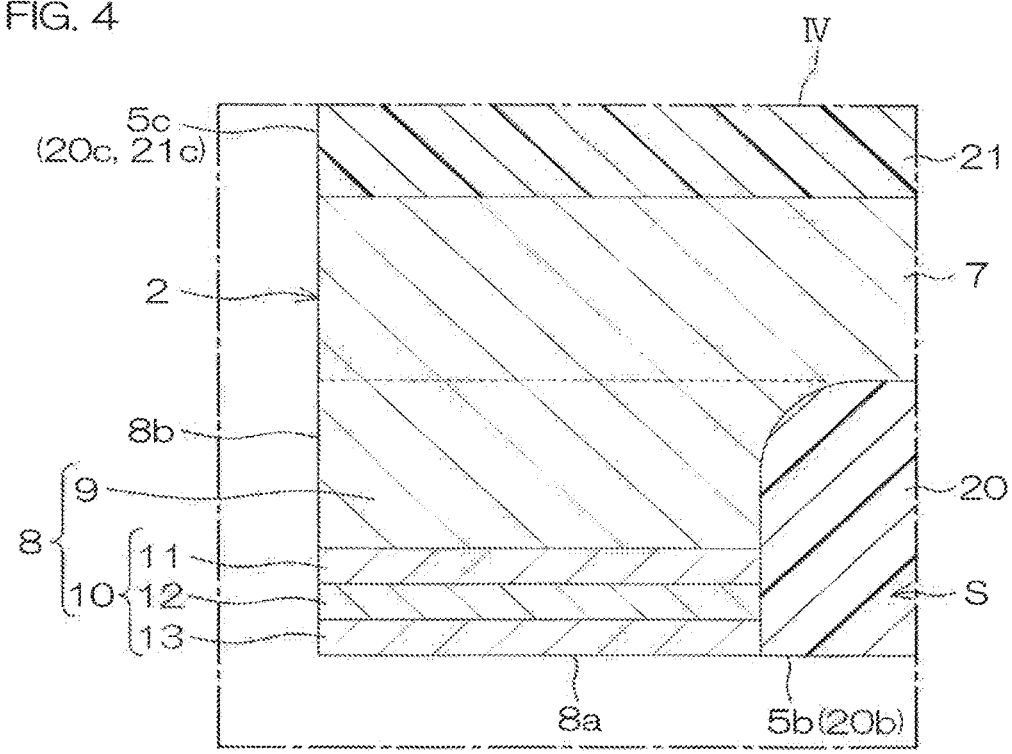
FIG. 4 is an enlarged view of a region surrounded by a dashed-dotted line IV shown in FIG. 2.
Figure 5:
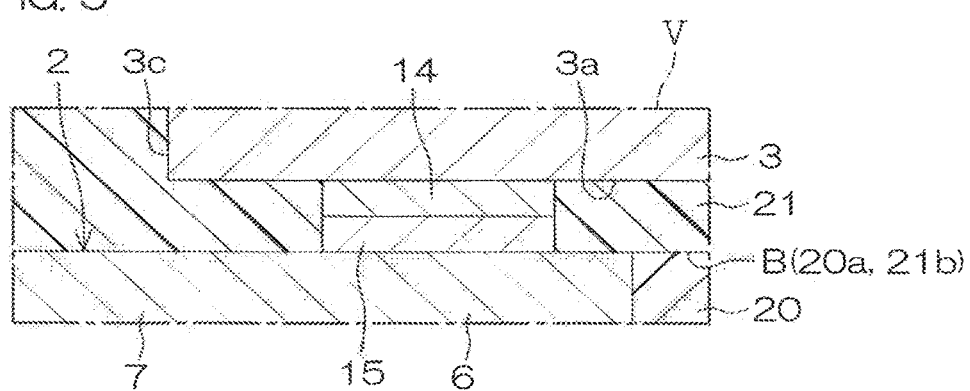
FIG. 5 is an enlarged view of a region surrounded by a dashed-dotted line V shown in FIG. 2.

FIG. 3 is a plan view showing a state in which the upper structure above the line III-III shown in FIG. 2 is removed. FIG. 4 is an enlarged view of a region surrounded by a dashed-dotted line IV shown in FIG. 2. FIG. 5 is an enlarged view of a region surrounded by a dashed-dotted line V shown in FIG. 2.

Referring to FIGS. 1 through 3, a semiconductor package referred to as a Quad Flat Non-leaded package (QFN), a Small Outlined Non-leaded Package (SON) and the like is applied to the semiconductor device 1. The semiconductor device 1 includes a plurality of leads 2, a semiconductor chip 3 which is arranged on the plurality of leads 2, and a sealing resin 4 which seals the plurality of leads 2 and the semiconductor chip 3. The sealing resin 4 is shown cross-hatched in FIG. 1 for the sake of clarity.

A semiconductor package body 5 that has a rectangular parallelopiped shape is formed by the sealing resin 4. The semiconductor package body 5 has an upper surface 5a, a lower surface 5b that is positioned opposite the upper surface 5a, and four lateral surfaces 5c that connect the upper surface 5a and the lower surface 5b.

The plurality of leads 2 is formed of, for example, Cu-based thin metal plate. The plurality of leads 2 may be a thin metal plate containing Cu as a major component. As an example, the plurality of leads 2 may be Cu—Fe based alloy or Cu—Zr based alloy. The plurality of leads 2 may be formed of a metal that includes a metal such as Fe excluding Cu as a major component and includes Cu as an accessory component. As an example, the plurality of leads 2 may be Cu doped alloy 42 or the like.

The plurality of leads 2 may be high purity copper that has a purity of at least 95%, high purity copper that has a purity of at least 99.99% (4N), or high purity copper that has a purity of at least 99.9999% (6N). A thin metal plate formed of FeNi based alloy may be used as the plurality of leads 2. A Cu-based thin metal plate may be preferably adopted as the material of the plurality of leads 2 from the viewpoint of manufacturing cost and resistivity.

The plurality of leads 2 includes the same number of leads (four leads in this embodiment) arranged respectively on one side and the other side of a pair of mutually opposing lateral surfaces 5c of the semiconductor package body 5. The plurality of leads 2 arranged on one lateral surface 5c is aligned equidistantly along the one lateral surface 5c. The plurality of leads 2 arranged on the other lateral surface 5c is aligned equidistantly along the other lateral surface 5c.

The plurality of leads 2 is formed into a rectangular shape in plan view extending along a direction orthogonal to an alignment direction. Each of the plurality of leads 2 has a lead body portion 7 and a lead connecting portion 8. Each lead body portion 7 has a mounting portion 6 which includes an upper surface whereon the semiconductor chip 3 is bonded. Each lead connecting portion 8 is formed for external connection. Each lead connecting portion 8 is formed so as to project downward from a lower surface of each lead body portion 7. Each lead connecting portion 8 includes a lower surface 8a and a lateral wall 8b.

A space S is defined by the lower surface of each lead body portion 7 and the lead connecting portion 8. The lateral wall 8b of each lead connecting portion 8 includes a first lateral wall 8b that defines the space S, and a second lateral wall 8b that is positioned outside the space S opposite the first lateral wall 8b.

Referring to FIG. 4, each lead connecting portion 8 includes a base portion 9 and a plated layer 10. The base portion 9 projects downward from the lower surface of the lead body portion 7, and the plated layer 10 is formed on the lower surface of the base portion 9. The plated layer 10 forms the entire region of the lower surface 8a of each lead connecting portion 8, and a part of the lateral wall 8b.

According to this embodiment, the plated layer 10 has a laminate structure in which a plurality of conductive layers is laminated. The plated layer 10 includes an Ni layer 11, a Pd layer 12, and an Au layer 13 laminated in order from the base portion 9. The plated layer 10 may have a two-layer structure that includes the Ni layer 11 and the Pd layer 12 laminated in order from the base portion 9. The plated layer 10 may have a single layer structure that includes any one of the Ni layer 11, the Pd layer 12, and the Au layer 13.

The semiconductor chip 3 has a rectangular parallelopiped shape. The semiconductor chip 3 has a first main surface 3a, a second main surface 3b that is positioned opposite the first main surface 3a, and four lateral surfaces 3c that connect the first main surface 3a and the second main surface 3b. In this embodiment, the first main surface 3a of the semiconductor chip 3 is also a surface in which a functional element is formed.

The semiconductor chip 3 has a plurality of electrode pads 14 (eight electrode pads in this embodiment) formed on the first main surface 3a side. Each electrode pad 14 includes, for example, Cu or Au. Each electrode pad 14 is electrically connected to the functional element via a wiring layer (not shown) formed on the first main surface 3a.

Referring to FIG. 2 and FIG. 5, each electrode pad 14 is bonded to the mounting portion 6 of the corresponding lead 2 via a conductive bonding material 15. Each electrode pad 14 is bonded to the corresponding lead 2 by a bonding technique referred to as C4 (Control Collapse Chip Connection). The conductive bonding material 15 may be solder. The conductive bonding material 15 may include Sn alloy, for example, Sn—Ag alloy or Sn—Ag—Cu alloy.

The semiconductor chip 3 is face-down mounted to a plurality of leads 2. The first main surface 3a of the semiconductor chip 3 is a facing surface that faces the plurality of leads 2. The second main surface 3b of the semiconductor chip 3 is a non-facing surface that does not face the plurality of leads 2.

Referring to FIG. 1 and FIG. 2, the sealing resin 4 includes a first sealing resin 20 and a second sealing resin 21. The first sealing resin 20 seals the space S that is defined by the lower surface of each lead body portion 7 and each lead connecting portion 8 in a region below the upper surface of each lead body portion 7. The second sealing resin 21 seals the semiconductor chip 3 in a region above the upper surface of the plurality of leads 2.

The first sealing resin 20 has a rectangular parallelopiped shape. The first sealing resin 20 has a thickness substantially equal to the thickness of the plurality of leads 2. The first sealing resin 20 has an upper surface 20a (first surface), a lower surface 20b (second surface) that is positioned opposite the upper surface 20a, and four lateral surfaces 20c that connect the upper surface 20a and the lower surface 20b.

The first sealing resin 20 exposes the lower surface 8a and the second lateral wall 8b that is positioned outside the space S of each lead connecting portion 8. The lower surface 8a and the lateral wall 8b of each lead connecting portion 8 exposed from the first sealing resin 20 are formed as an external connection terminal.

The second sealing resin 21 has a rectangular parallelopiped shape. The second sealing resin 21 has a thickness larger than the thickness of the first sealing resin 20. The second sealing resin 21 has an upper surface 21a, a lower surface 21b that is positioned opposite the upper surface 21a, and four lateral surfaces 21c that connect the upper surface 21a and the lower surface 21b.

The second sealing resin 21 covers the first main surface 3a, the second main surface 3b, and the lateral surface 3c of the semiconductor chip 3 in a region above the upper surface of the plurality of leads 2. The second sealing resin 21 enters a region between the first main surface 3a of the semiconductor chip 3 and the first sealing resin 20.

A boundary portion B where the upper surface 20a of the first sealing resin 20 and the lower surface 21b of the second sealing resin 21 are in contact with each other is formed in a region between the lower surface of each lead body portion 7 and the first main surface 3a of the semiconductor chip 3. The boundary portion B is positioned substantially on the same plane as the upper surface of each lead body portion 7. Therefore, the upper surface 20a of the first sealing resin 20 and the lower surface 21b of the second sealing resin 21 are positioned substantially on the same plane as the upper surface of each lead body portion 7.

The lateral surface 20c of the first sealing resin 20 and the lateral surface 21c of the second sealing resin 21 are formed flush with each other. The lateral wall 8b of each lead connecting portion 8 is formed flush with the lateral surface 20c of the first sealing resin 20. The lower surface 8a of each lead connecting portion 8 is formed flush with the lower surface 20b of the first sealing resin 20.

The semiconductor package body 5 is formed by the sealing resin 4 that has a laminate structure which includes the first sealing resin 20 and the second sealing resin 21. Therefore, the upper surface 5a of the semiconductor package body 5 is formed by the upper surface 21a of the second sealing resin 21. The lower surface 5b of the semiconductor package body 5 is formed by the lower surface 20b of the first sealing resin 20. Further, the lateral surface 5c of the semiconductor package body 5 is formed by the lateral surface 20c of the first sealing resin 20 and the lateral surface 21c of the second sealing resin 21.

The first sealing resin 20 and the second sealing resin 21 are preferably formed of the same resin material. In this case, the thermal expansion coefficient of the first sealing resin 20 and the thermal expansion coefficient of the second sealing resin 21 are equal to each other.

Therefore, when the heat is applied to the semiconductor package body 5, the stress generated in the semiconductor package body 5 due to the thermal expansion in the first sealing resin 20 and the stress generated in the semiconductor package body 5 due to the thermal expansion in the second sealing resin 21 are substantially equal to each other. The warpage of the semiconductor package body 5 can be reduced.

The first sealing resin 20 and the second sealing resin 21 may be formed of mutually different resin materials. For example, an epoxy resin, a polyimide resin, an acryl resin and the like can be listed as resin materials of the first sealing resin 20 and the second sealing resin 21.

Figure 6:
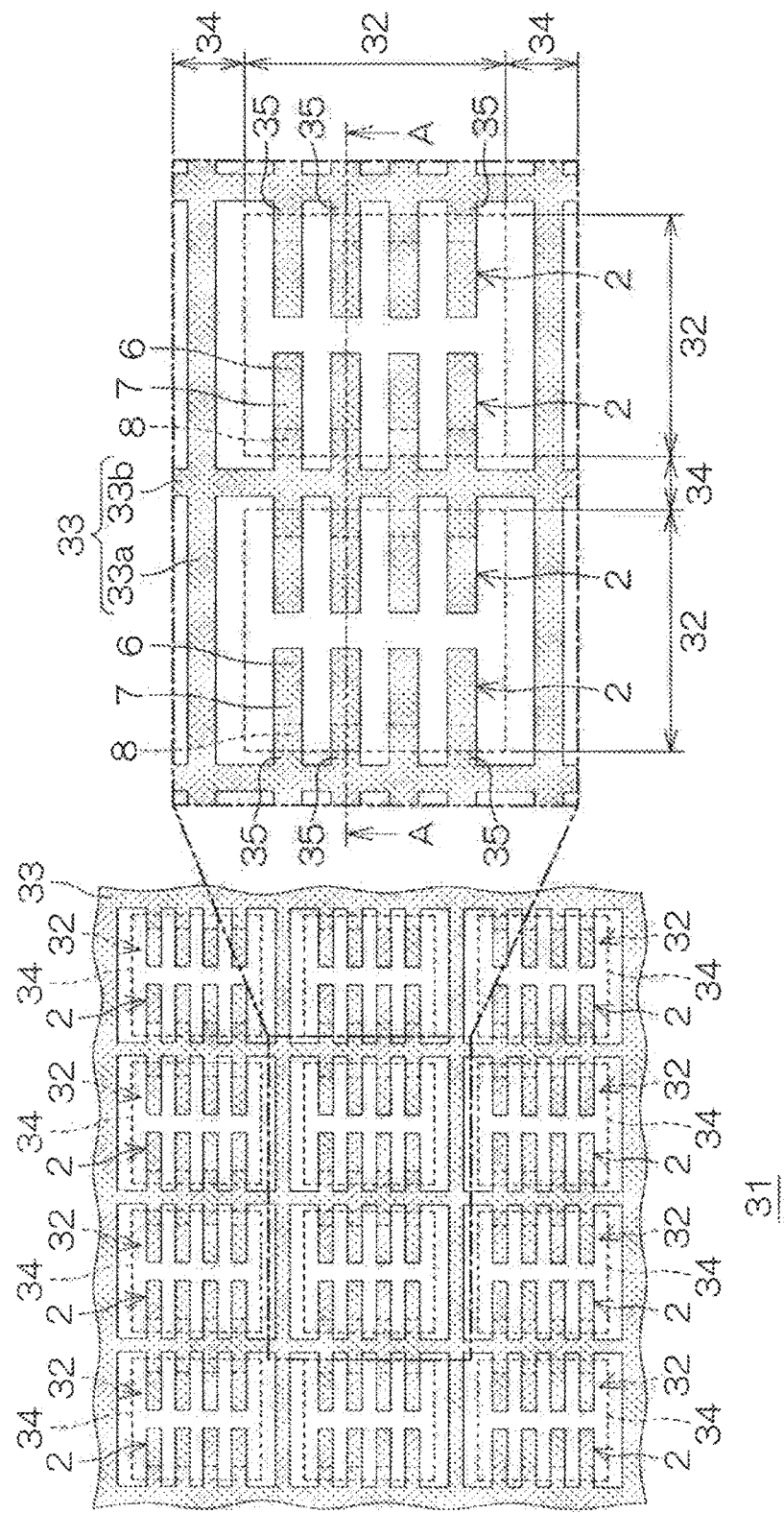
FIG. 6 is a plan view showing a lead frame used for manufacturing the semiconductor device shown in FIG. 1.

FIG. 6 is a plan view showing a lead frame 31 used for manufacturing the semiconductor device 1 shown in FIG. 1. In FIG. 6, the lead frame 31 is shown dot-hatched for the sake of clarity.

The lead frame 31 is formed by punching out a piece of rectangular thin metal plate into a predetermined shape, for example, by precision press processing. In this embodiment, the thin metal plate is formed of high purity copper. The lead frame 31 includes a lattice shaped frame member 33 that defines a plurality of semiconductor device forming regions 32.

The frame member 33 includes a plurality of lateral frame members 33a that extends laterally, and a plurality of vertical frame members 33b that extends vertically perpendicular to the lateral direction. The plurality of semiconductor device forming regions 32 that has a rectangular shape in plan view is defined by the lateral frame members 33a and the vertical frame members 33b. Dicing regions 34 to be removed by grinding or the like is formed in a region between the plurality of semiconductor device forming regions 32.

The lead frame 31 includes a plurality of leads 2 formed in each semiconductor device forming regions 32. Each of the plurality of leads 2 includes the lead body portion 7 that has the mounting portion 6 which includes an upper surface whereon the semiconductor chip 3 is bonded, and the lead connecting portion 8 for external connection which projects downward from the lower surface of the lead body portion 7.

The lead frame 31 includes support portions 35 which couples the plurality of leads 2 to the frame member 33. Each lead connecting portion 8 is integrally coupled to the frame member 33 (here, vertical frame member 33b) via the support portion 35. In this manner, the plurality of leads 2 is retained by the frame member 33 via the support portion 35.

Next, an example of a method for manufacturing the semiconductor device 1 will be described. FIGS. 7A through 7H are views showing a method for manufacturing the semiconductor device 1 shown in FIG. 1. FIGS. 7A through 7H are cross-sectional views taken along the line A-A shown in FIG. 6.

First, referring to FIG. 7A, the above-described lead frame 31 (see FIG. 6) is prepared. The lead frame 31 has an upper surface 31a and a lower surface 31b.

Next, a support tape 36 which supports the lead frame 31 is attached to the lower surface 31b of the lead frame 31. In this embodiment, the plated layer 10 is previously formed on the base portion 9 of each lead connecting portion 8 (see also FIG. 4). Therefore, the support tape 36 is attached to the plated layer 10. The support tape 36 may include a resin tape.

Figure 7B:
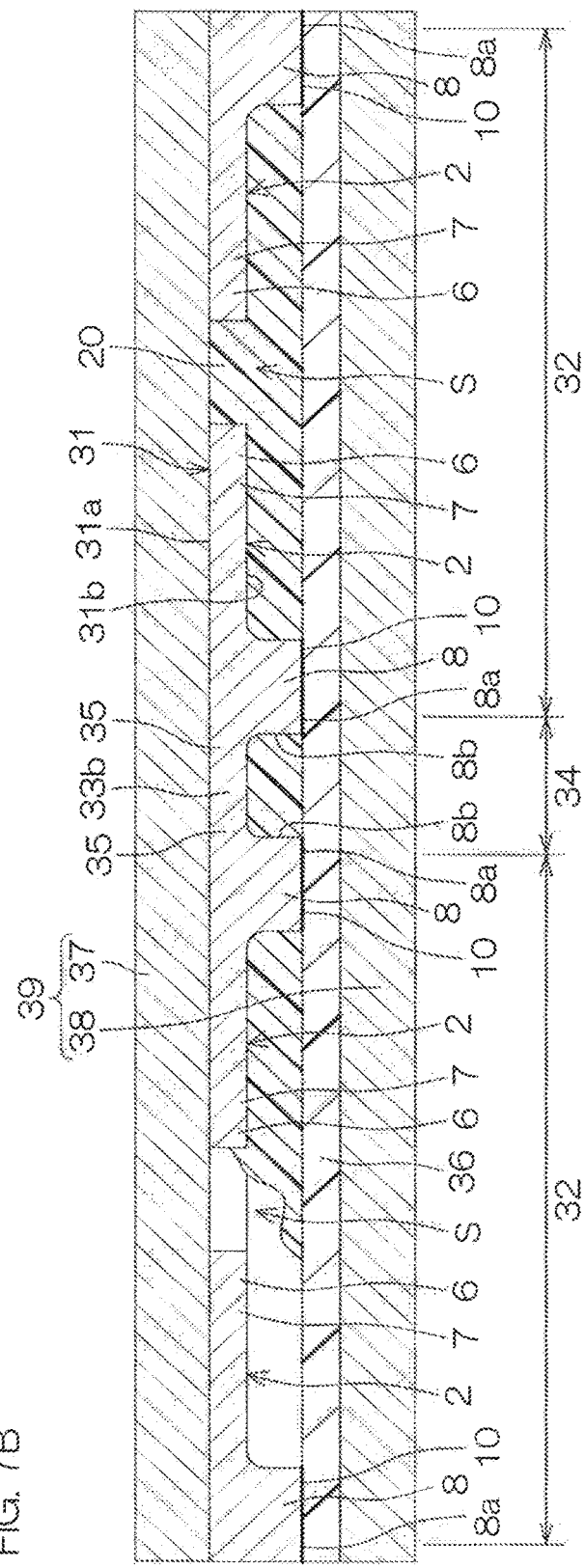

Referring to FIG. 7B, a first mold 39 that includes a first upper mold 37 and a first lower mold 38 is prepared in parallel with the preparation of the lead frame 31. The first mold 39 is a mold for transfer molding, for example.

The first mold 39 has an inner space that has a predetermined height that is defined by the first upper mold 37 and the first lower mold 38. The lead frame 31 is arranged in the first mold 39. In a state where the lead frame 31 is arranged in the first mold 39, the upper surface 31a of the lead frame 31 is in contact with the first upper mold 37 of the first mold 39 and is covered with the first upper mold 37.

Next, in a state where the upper surface 31a of the lead frame 31 is covered with the first upper mold 37, the first sealing resin 20 is supplied into the first mold 39. Thereby, the space S that is defined by the lower surface of each lead body portion 7 and the lead connecting portion 8 is sealed by the first sealing resin 20 in the region below the upper surface of each lead body portion 7.

Referring to FIG. 7C, in the step of supplying the first sealing resin 20, the entire area of the lower surface 31b of the lead frame 31 is collectively sealed by the first sealing resin 20. Thereby, a lead frame intermediate body 41 in which the plurality of leads 2 fixed to the frame member 33 by the first sealing resin 20 is formed. That is, in the lead frame intermediate body 41, the plurality of leads 2 is fixedly supported with respect to the frame member 33 by the first sealing resin 20.

The lead frame intermediate body 41 includes an upper surface 41a molded by the first upper mold 37 and a lower surface 41b covered with the support tape 36. The upper surface 41a of the lead frame intermediate body 41 is formed by the upper surface 31a of the lead frame 31 and the upper surface 20a of the first sealing resin 20. The lower surface 41b of the lead frame intermediate body 41 is formed by the lower surface 8a of the lead connecting portion 8 and the lower surface 20b of the first sealing resin 20.

The upper surface 31a of the lead frame 31 and the upper surface 20a of the first sealing resin 20 are formed flush with each other. The lower surface 8a of the lead connecting portion 8 and the lower surface 20b of the first sealing resin 20 are formed flush with each other.

Figure 7D:
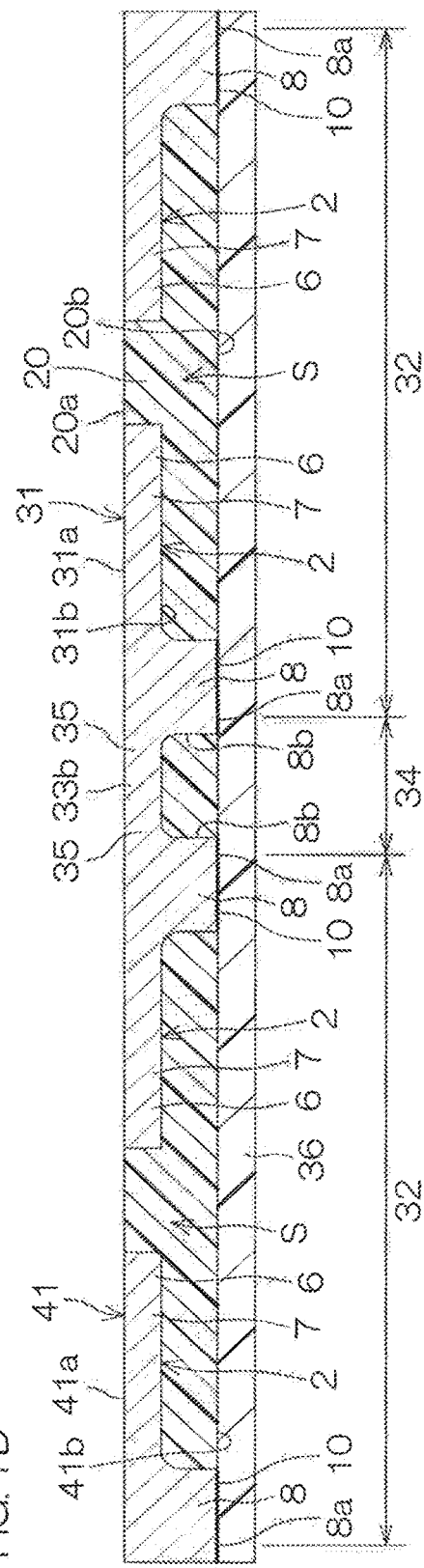

Next, referring to FIG. 7D, the lead frame intermediate body 41 is taken out from the first mold 39. In a state where the lead frame intermediate body 41 is taken out, the upper surface 31a of the lead frame 31 is exposed from the upper surface 41a of the lead frame intermediate body 41.

Figure 7E:
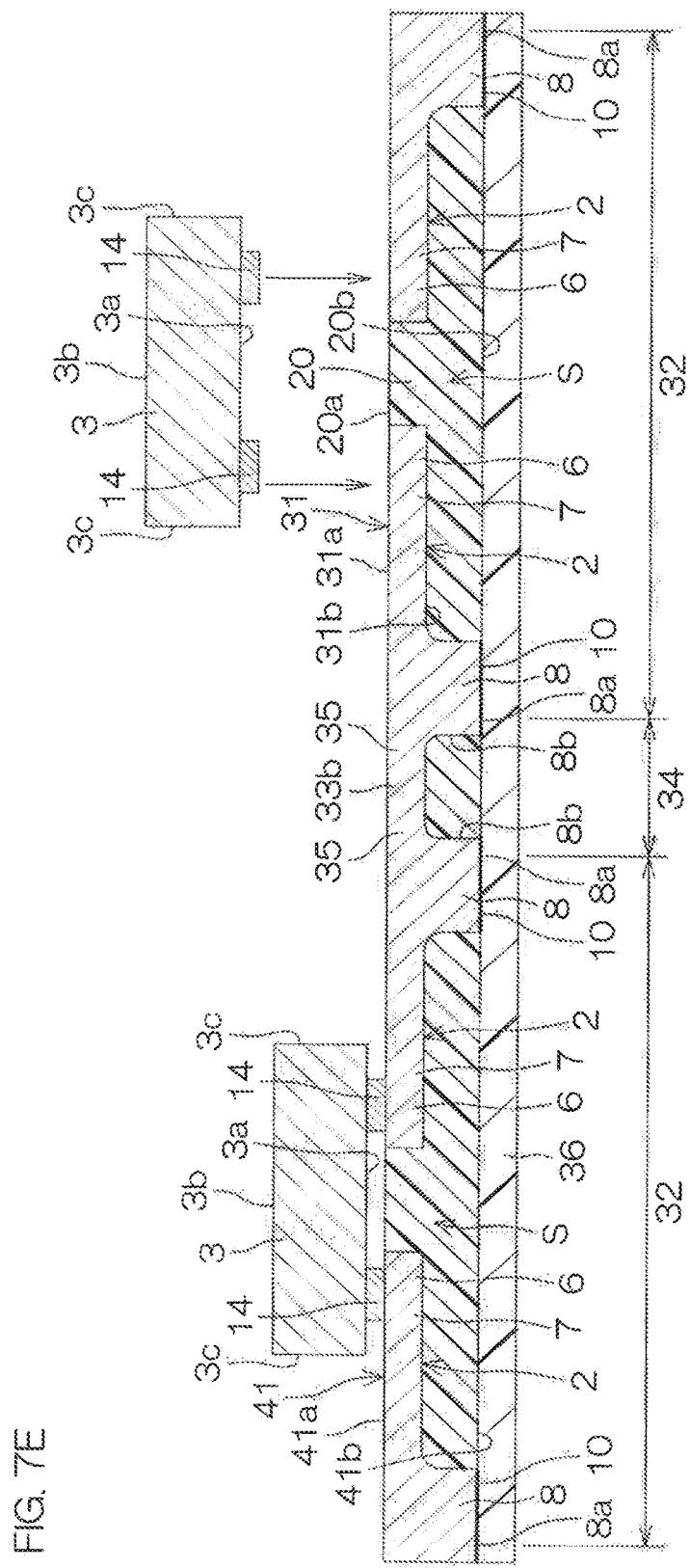

Next, referring to FIG. 7E, a plurality of semiconductor chips 3 is arranged one by one in the plurality of semiconductor device forming regions 32. The semiconductor chip 3 is bonded onto the mounting portion 6 of the plurality of leads 2 exposed from the upper surface 20a of the first sealing resin 20. In this step, the plurality of electrode pads 14 is bonded onto the corresponding mounting portion 6 via the conductive bonding material 15 (see also FIG. 5). Thereby, the plurality of semiconductor chips 3 is face-down mounted in a manner where the first main surface 3a faces the plurality of leads 2.

Referring to FIG. 7F, a second mold 44 that includes a second upper mold 42 and a second lower mold 43 is prepared in parallel with the preparation of the lead frame 31. The second mold 44 is, for example, a mold for transfer molding.

The second mold 44 has an inner space that has a predetermined height that is defined by the second upper mold 42 and the second lower mold 43. The lead frame intermediate body 41 in a state where the semiconductor chip 3 is mounted thereon is arranged in the second mold 44. In a state where the lead frame intermediate body 41 is arranged in the second mold 44, a space that has a predetermined height is provided between the second upper mold 42 of the second mold 44 and the second main surface 3b of the semiconductor chip 3.

Next, the second sealing resin 21 is supplied into the second mold 44. The plurality of semiconductor chips 3 is collectively sealed by the second sealing resin 21 on the lead frame intermediate body 41. Thereby, a sealing structure 51 wherein the plurality of semiconductor chips 3 is collectively sealed on the lead frame intermediate body 41 is formed.

The sealing structure 51 has an upper surface 51a molded by the second upper mold 42 and a lower surface 51b covered with the support tape 36. The upper surface 51a of the sealing structure 51 is formed by the upper surface 21a of the second sealing resin 21. The lower surface 51b of the sealing structure 51 is formed by the lower surface 41b of the lead frame intermediate body 41.

In the step of forming the sealing structure 51, the boundary portion B where the upper surface 20a of the first sealing resin 20 and the lower surface 21b of the second sealing resin 21 are in contact with each other is formed in a region between the lower surface of each lead body portion 7 and the first main surface 3a of the semiconductor chip 3. The boundary portion B is formed and positioned on the same plane as the upper surface of each lead body portion 7.

In the step of creating the sealing structure 51, the second sealing resin 21 formed of the same resin material as the resin material of the first sealing resin 20 is preferably supplied in the second mold 44. In this case, the stress generated in the lead frame 31 and the like due to the thermal expansion in the first sealing resin 20 and the stress generated in the lead frame 31 and the like due to the thermal expansion in the second sealing resin 21 become substantially equal to each other. Therefore, the warpage of the lead frame intermediate body 41 and the sealing structure 51 can be reduced.

Next, referring to FIG. 7G, the sealing structure 51 is taken out from the second mold 44. Next, the support tape 36 is removed (peeled off) from the lower surface 51b of the sealing structure 51. Thereby, the lower surface 8a of each lead connecting portion 8 of the plurality of leads 2 is exposed from the lower surface 51b of the sealing structure 51.

The step of removing (peeling off) the support tape 36 may be performed before the step of forming the sealing structure 51 (see FIG. 7F) after the above-described step of taking out the lead frame intermediate body 41 from the first mold 39 (see FIG. 7D).

Next, referring to FIG. 7H, the sealing structure 51 is cut along a dicing region 34, for example by using a dicing blade 52. In this embodiment, a part of the support portion 35 and the entire part of the frame member 33 are removed. In this way, a plurality of semiconductor devices 1 is diced out.

The diced-out semiconductor device 1 has a structure wherein the second lateral wall 8b that is positioned outside the space S in each lead connecting portion 8 of the plurality of leads 2 is exposed from the first sealing resin 20. In this way, the semiconductor device 1 is manufactured.

As described above, according to the manufacturing method of this embodiment, the sealing step by the first sealing resin 20 (see FIG. 7C) is performed before the mounting step of the semiconductor chip 3 (see FIG. 7E). The first sealing resin 20 seals the space S that is defined by the lower surface of each lead body portion 7 of the plurality of leads 2 retained by the frame member 33 and the lead connecting portion 8. Through those steps, the lead frame intermediate body 41 wherein the first sealing resin 20 and the lead frame 31 are integrated is formed (see FIG. 7C and FIG. 7D).

According to the lead frame intermediate body 41, the plurality of leads 2 is fixed to the frame member 33 by the first sealing resin 20, so that the plurality of leads 2 can be prevented from being deformed due to an external force or the like. Therefore, the lead frame 31 can be prevented from being deformed when moving the lead frame intermediate body 41, for example when taking out the lead frame intermediate body 41 from the first mold 39 (see FIG. 7D).

Further, in the mounting step of the semiconductor chip 3 (see FIG. 7E), the semiconductor chip 3 can be bonded onto the mounting portion 6 of the plurality of leads 2 fixed to the frame member 33, so that the plurality of leads 2 can be prevented from being deformed due to application of weight during the mounting step (see FIG. 7E). Thereby, the connection failure between the semiconductor chips 3 and the plurality of leads 2 can be suppressed.

Therefore, the semiconductor devices 1 that has favorable electrical connection between the semiconductor chip 3 and the plurality of leads 2 can be produced and provided in high yield. Further, it is possible to provide the lead frame intermediate body 41 that is easy to handle and can contribute to an improvement of the yield.

When a conductive material containing high-purity copper or copper as a major component is used as a material for the lead frame 31, the lead frame 31 has relatively low modulus of rigidity, although using a low resistivity material is an advantage. Therefore, the lead frame 31 containing high-purity copper or copper as a major component is susceptible to deformation compared to a lead frame formed of, for example, a conductive material containing copper as an accessory component or other materials different from copper (for example nickel).

Here, the lead frame 31 containing high-purity copper or copper as a major component is reinforced by the first sealing resin 20 applied thereto, and thus the lead frame 31 (lead frame intermediate body 41) that has low resistivity and is hardly susceptible to deformation can be provided. Therefore, it is possible to provide the semiconductor device 1 that has a structure wherein the semiconductor chip 3 is favorably bonded on the plurality of low-resistance leads 2.

Further, according to the manufacturing method of this embodiment, it is possible to provide the semiconductor device 1 that has a structure wherein the lower surface 8a and the lateral wall 8b of each lead connecting portion 8 are exposed from the first sealing resin 20. Therefore, when the semiconductor device 1 is mounted onto a mounting substrate, the connection area of each lead connecting portion 8 with respect to a conductive bonding material (for example solder) can be favorably secured. Thereby, the connection strength between the semiconductor device 1 and the mounting substrate can be increased.

Second Embodiment

Figure 8:
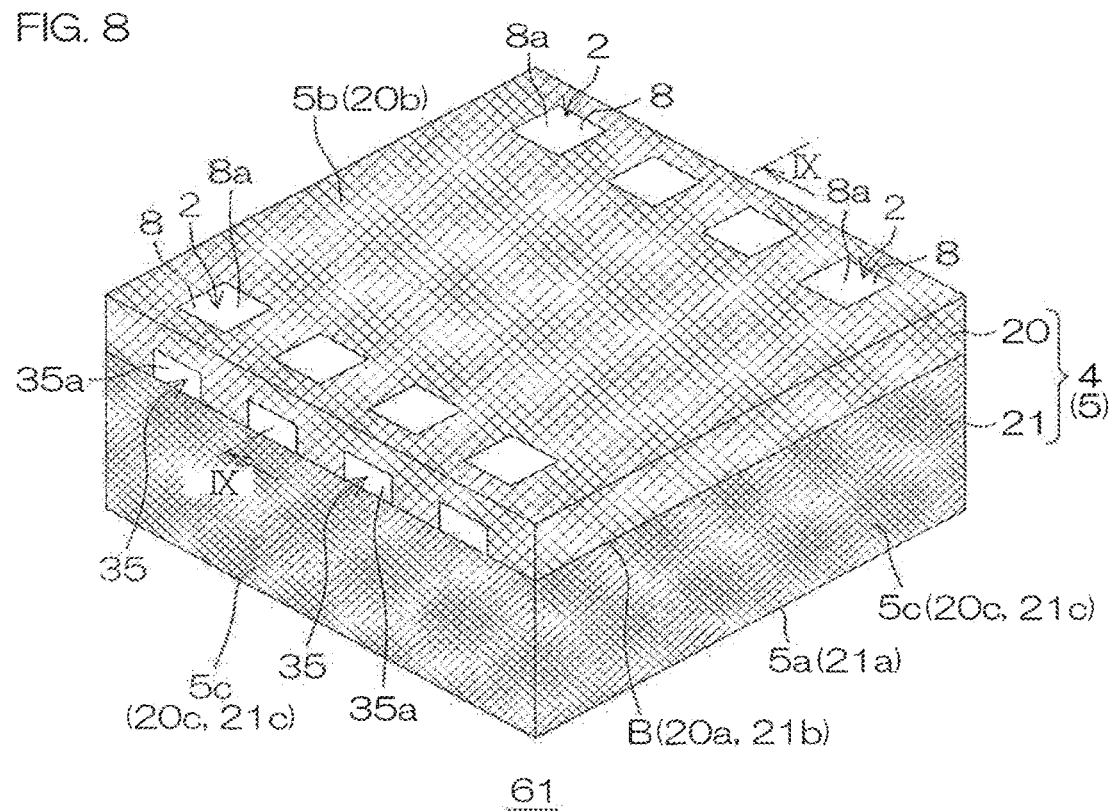
FIG. 8 is a perspective view of a semiconductor device according to a second embodiment of the present invention as viewed from a lower surface side.
Figure 9:
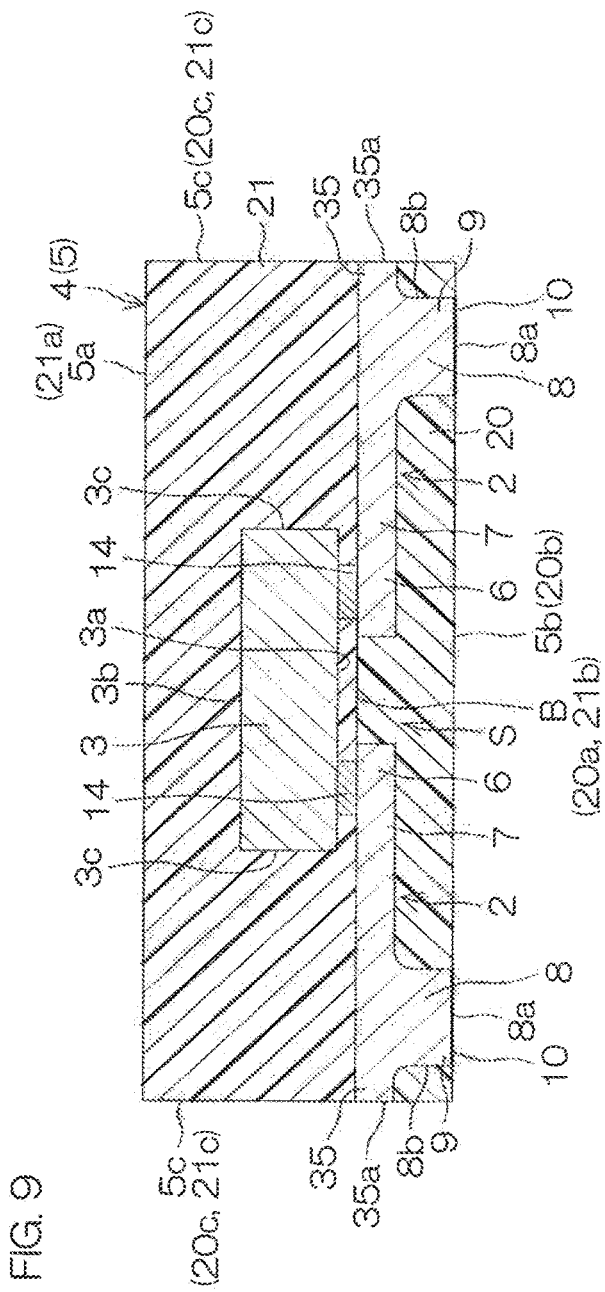
FIG. 9 is a cross-sectional view taken along the line IX-IX shown in FIG. 8.

FIG. 8 is a perspective view of a semiconductor device 61 according to a second embodiment of the present invention as viewed from the lower surface. FIG. 9 is a cross-sectional view taken along the line IX-IX shown in FIG. 8. FIG. 9 shows a state in which the semiconductor device 61 shown in FIG. 8 is turned upside down. In FIG. 8 and FIG. 9, the same reference numerals are applied to the same structures as those described in the first embodiment, and the description thereof is omitted.

The semiconductor device 61 according to the second embodiment is diced out from the sealing structure 51 through the above-described dicing step (see FIG. 7H). In the dicing step according to the second embodiment (see FIG. 7H), the grinding width of the dicing blade 52 is formed narrower than the width of the dicing region 34.

More specifically, in the dicing step according to the second embodiment (see FIG. 7H), the frame member 33 is removed in such a manner that a part of the support portion 35 remains. Therefore, in each lead connecting portion 8 of the diced-out semiconductor device 61, the second lateral wall 8b that is positioned outside the space S, in addition to the first lateral wall 8b defining the space S, is also sealed by the first sealing resin 20.

As described above, in the semiconductor device 61 according to the second embodiment, the entire portion of the lateral wall 8b of each lead connecting portion 8 is covered with the first sealing resin 20. Therefore, only the lower surface 8a of each lead connecting portion 8 is exposed from the lower surface 20b of the first sealing resin 20 (the lower surface 5b of the semiconductor package body 5).

Further, in the semiconductor device 61 according to the second embodiment, a part of the support portion 35 of the lead frame 31 is exposed from the lateral surface 20c of the first sealing resin 20. An exposed surface 35a of the support portion 35 is formed flush with the lateral surface 20c of the first sealing resin 20 and the lateral surface 21c of the second sealing resin 21.

As described above, according to the semiconductor device 61 of this embodiment, only the lower surface 8a of each lead connecting portion 8 of the plurality of leads 2 is exposed from the lower surface 5b of the semiconductor package body 5. With this configuration, a conductive bonding material can be arranged within the occupation area of the semiconductor device 61 with respect to the mounting substrate. When solder is used as the conductive bonding material, the solder can also be prevented from wetly spreading the lateral side of the semiconductor device 61. As a result, the mounting area required for mounting the semiconductor device 61 can be reduced.

According to this embodiment, an example wherein a part of the support portion 35 is exposed from the lateral surface 20c of the first sealing resin 20 is described. However, the semiconductor device that has a structure wherein a part of the frame member 33 is exposed from the lateral surface 20c of the first sealing resin 20 may be adopted.

A part of the frame member 33 may be a part of the lateral frame member 33a and/or a part of the vertical frame member 33b. The semiconductor device that has such structures can be manufactured by adjusting the grinding width of the dicing blade 52 in the dicing step (see FIG. 7H).

Third Embodiment

Figure 10:
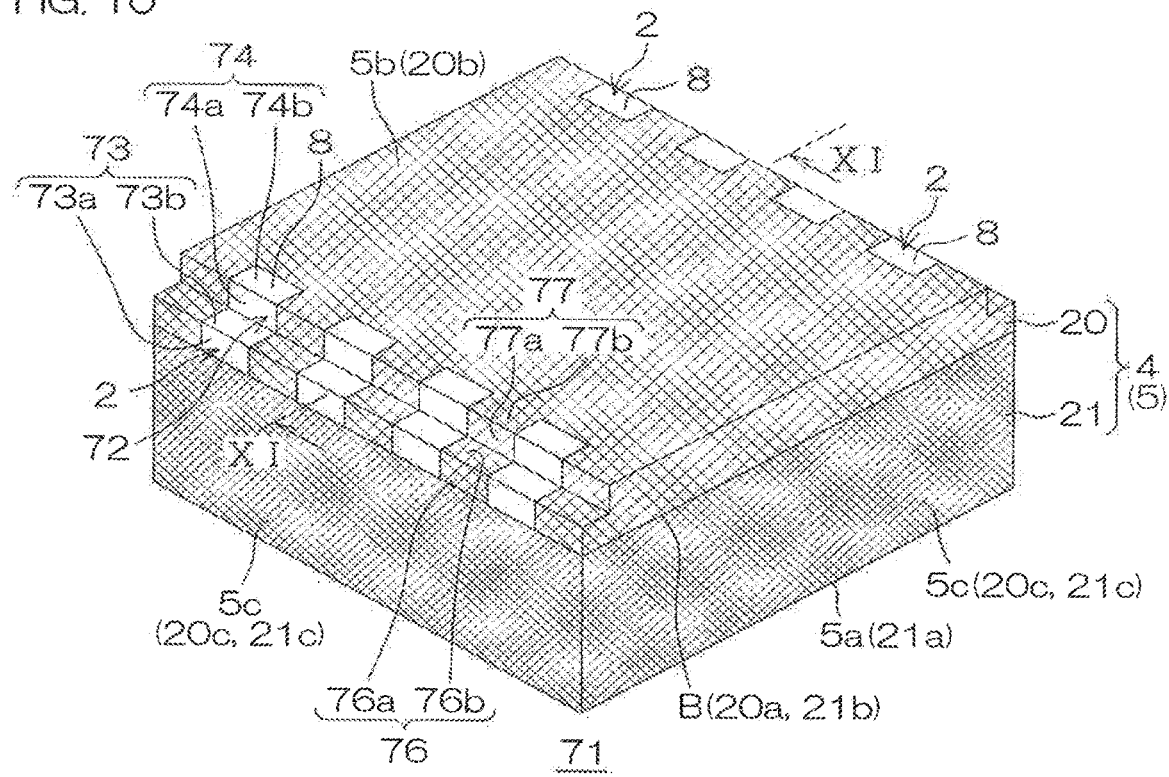
FIG. 10 is a perspective view of a semiconductor device according to a third embodiment of the present invention as viewed from a lower surface side.
Figure 11:
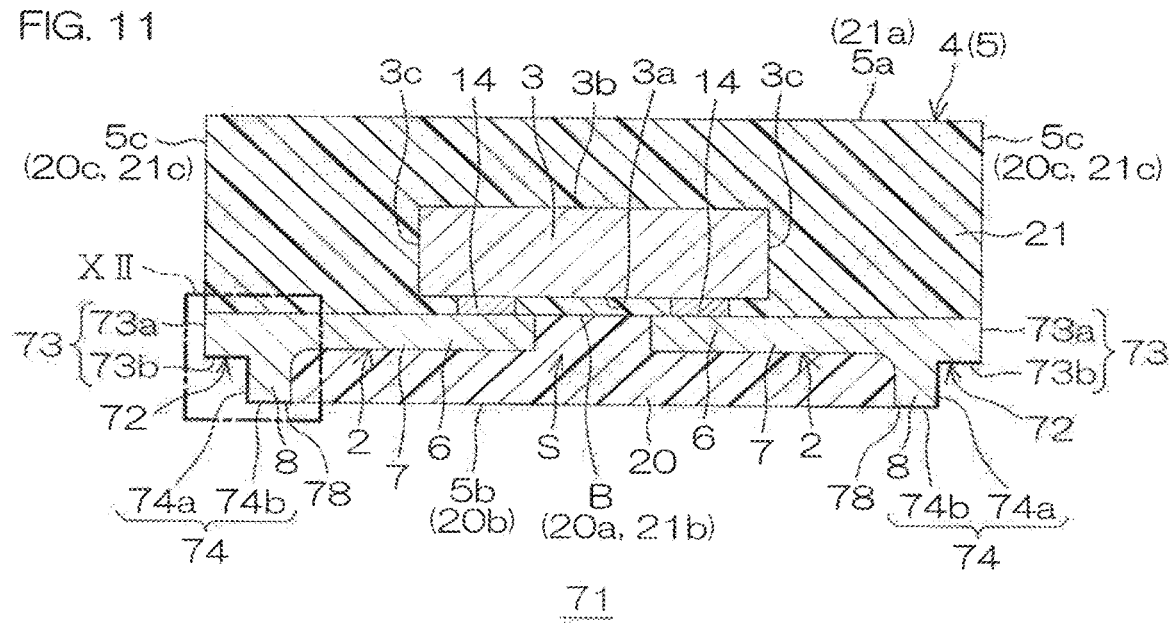
FIG. 11 is a cross-sectional view taken along the line XI-XI shown in FIG. 10.
Figure 12:
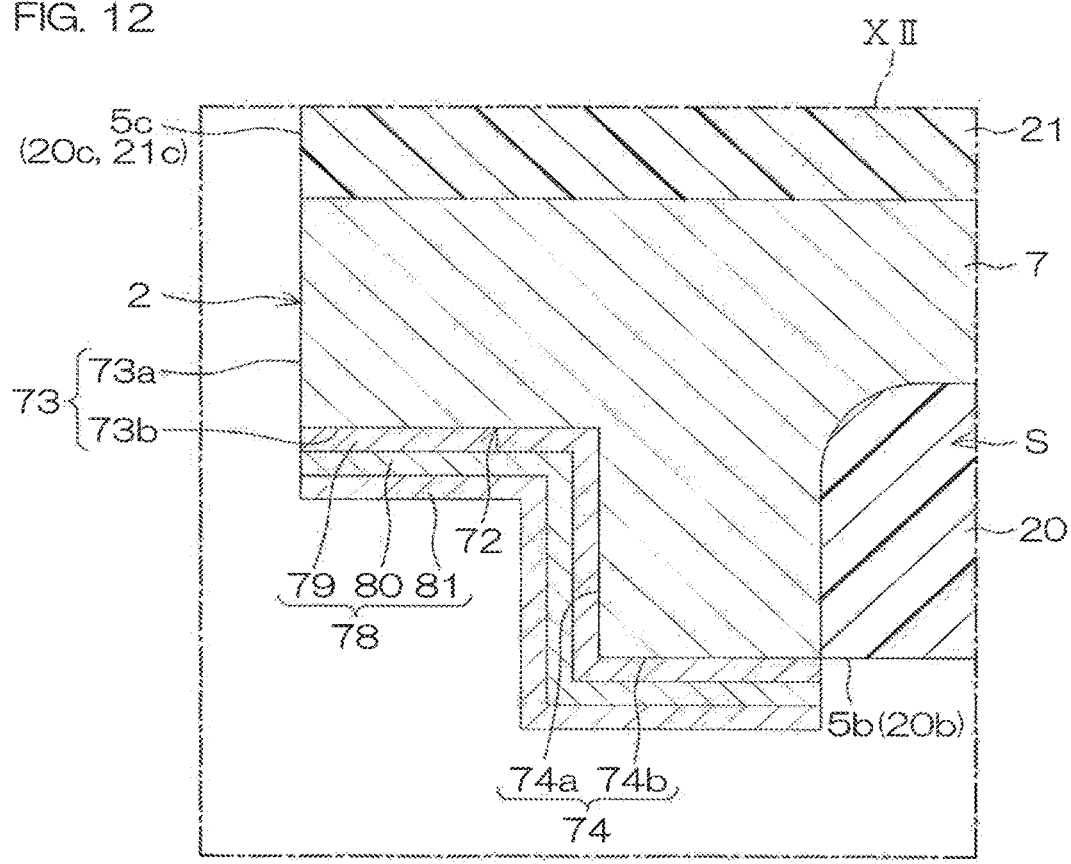
FIG. 12 is an enlarged view of a region surrounded by a dashed-dotted line XII shown in FIG. 11.

FIG. 10 is a perspective view of a semiconductor device 71 according to a third embodiment of the present invention as viewed from lower surface side. FIG. 11 is a cross-sectional view taken along the line XI-XI shown in FIG. 10. FIG. 12 is an enlarged view of a region surrounded by a dashed-dotted line XII shown in FIG. 11. FIG. 11 shows a state in which the semiconductor device 71 shown in FIG. 10 is turned upside down. Further, the sealing resin 4 is shown cross-hatched in FIG. 11 for the sake of clarity.

The semiconductor device 71 according to the third embodiment is different from the structure of the semiconductor 1 in that each lead connecting portion 8 of the plurality of leads 2 has a lead notched portion 72. The other structures of the semiconductor device 71 according to the third embodiment are substantially the same as those of the semiconductor device 1. In FIGS. 10 through 12, the same reference numerals are applied to the same structures as those described in the first embodiment, and the description thereof is omitted.

Referring to FIG. 10 and FIG. 11, the lead notched portion 72 is formed by digging down the first sealing resin 20 from the lower surface 20b toward the upper surface 20a. Each lead notched portion 72 has a step-like shape that includes a first step portion 73 and a second step portion 74. The first step portion 73 and the second step portion 74 are formed in order from the lateral surface 20c of the first sealing resin 20.

The first step portion 73 of each lead connecting portion 8 is formed on the side of the upper surface 20a of the first sealing resin 20. The first step portion 73 of each lead connecting portion 8 includes a first lateral surface 73a and a first lower surface 73b. The second step portion 74 of each lead connecting portion 8 is formed on the side of the lower surface 20b of the first sealing resin 20. The second step portion 74 of each lead connecting portion 8 includes a second lateral surface 74a and a second lower surface 74b.

The first lateral surface 73a of the first step portion 73 and the second lateral surface 74a of the second step portion 74 extend in the same direction as the lateral surface 20c of the first sealing resin 20. The first lower surface 73b of the first step portion 73 and the second lower surface 74b of the second step portion 74 extend in the same direction as the lower surface 20b of the first sealing resin 20.

The ratio of vertical length of the first lateral surface 73a of the first step portion 73 to vertical length of the second lateral surface 74a of the second step portion 74 (first lateral surface 73a/second lateral surface 74a) is preferably less than or equal to 1. In this case, the contact area between a conductive bonding material (for example solder) and the second lateral surface 74a can be increased. Thereby, the connection strength between the semiconductor device 71 and a mounting substrate can be increased.

The first sealing resin 20 has a resin notched portion 75. The resin notched portion 75 is formed by digging down the first sealing resin 20 from the lower surface 20b toward the upper surface 20a. The resin notched portion 75 is in communication with the lead notched portion 72 of each lead connecting portion 8. The resin notched portion 75 has a step-like shape that includes a first step portion 76 and a second step portion 77. The first step portion 76 and the second step portion 77 are formed in order from the lateral surface 20c of the first sealing resin 20.

The first step portion 76 of the first sealing resin 20 includes a first lateral surface 76a and a first lower surface 76b. The first lateral surface 76a of the first sealing resin 20 is formed flush with the first lateral surface 73a of each lead connecting portion 8. The first lower surface 76b of the first sealing resin 20 is formed flush with the first lower surface 73b of each lead connecting portion 8.

The second step portion 77 of the first sealing resin 20 includes a second lateral surface 77a and a second lower surface 77b. The second lateral surface 77a of the first sealing resin 20 is formed flush with the second lateral surface 74a of each lead connecting portion 8. The second lower surface 77b of the first sealing resin 20 is formed flush with the second lower surface 74b of each lead connecting portion 8. A part of the lower surface 20b of the first sealing resin 20 is formed by the second lower surface 77b of the first sealing resin 20.

Referring to FIG. 12, a plated layer 78 is continuously formed on the first lower surface 73b, the second lateral surface 74a, and the second lower surface 74b of each lead connecting portion 8 exposed from the first sealing resin 20. According to this embodiment, the plated layer 78 has a laminate structure wherein a plurality of conductive layers is laminated. The plated layer 78 includes an Ni layer 79, a Pd layer 80, and an Au layer 81 laminated in order from the each lead connecting portion 8.

The plated layer 78 may have a two-layer structure that includes the Ni layer 79 and the Pd layer 80 laminated in order from each lead connecting portion 8. The plated layer 78 is not formed on the first lateral surface 73a of each lead connecting portion 8. The plated layer 78 is not covered with the first sealing resin 20.

Next, an example of a manufacturing method for the semiconductor device 71 will be described. FIGS. 13A through 13D are views showing the manufacturing method for the semiconductor device 71 shown in FIG. 10. FIGS. 13A through 13D are cross-sectional views taken along the line A-A shown in the above-described FIG. 6.

Referring to FIG. 13A, in the manufacturing method of the semiconductor device 71, the sealing structure 51 is manufactured through steps similar to those shown in FIGS. 7A through 7G. In the manufacturing method of the semiconductor device 71, the plated layer 10 (see FIGS. 7A through 7G) is not formed on the lower surface 8a of the lead connecting portion 8.

Figure 13B:
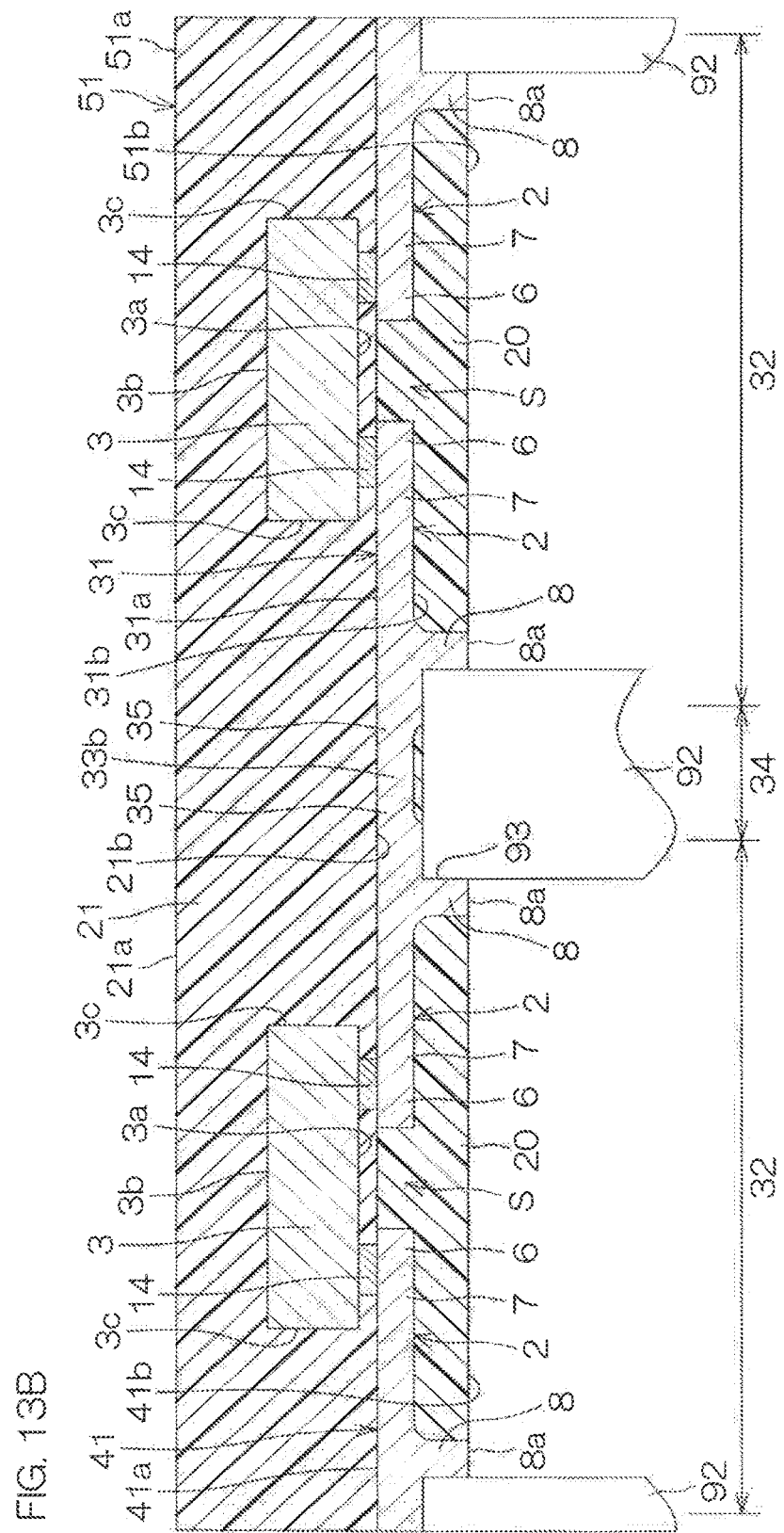

Next, referring to FIG. 13B, a part of the dicing region 34 and a part of the lead connecting portion 8 are removed from the lower surface 51b toward the upper surface 51a of the sealing structure 51, for example, by a dicing blade 92. The dicing blade 92 has a larger grinding width than the width of the dicing region 34. A part of the lead connecting portion 8 and a part of the first sealing resin 20 are removed to the midway position of the first sealing resin 20 in the thickness direction. Thereby, a groove 93 that has a larger width than the width of the dicing region 34 is formed in the lower surface 51b of the sealing structure 51.

Next, referring to FIG. 13C, the Ni layer 79, the Pd layer 80, and the Au layer 81 are formed in that order on each lead connecting portion 8 exposed from the lower surface 51b of the sealing structure 51, for example, by electroplating or electroless plating. Thereby, the plated layer 78 is formed on each lead connecting portion 8 exposed from the lower surface 51b of the sealing structure 51.

Figure 13D:
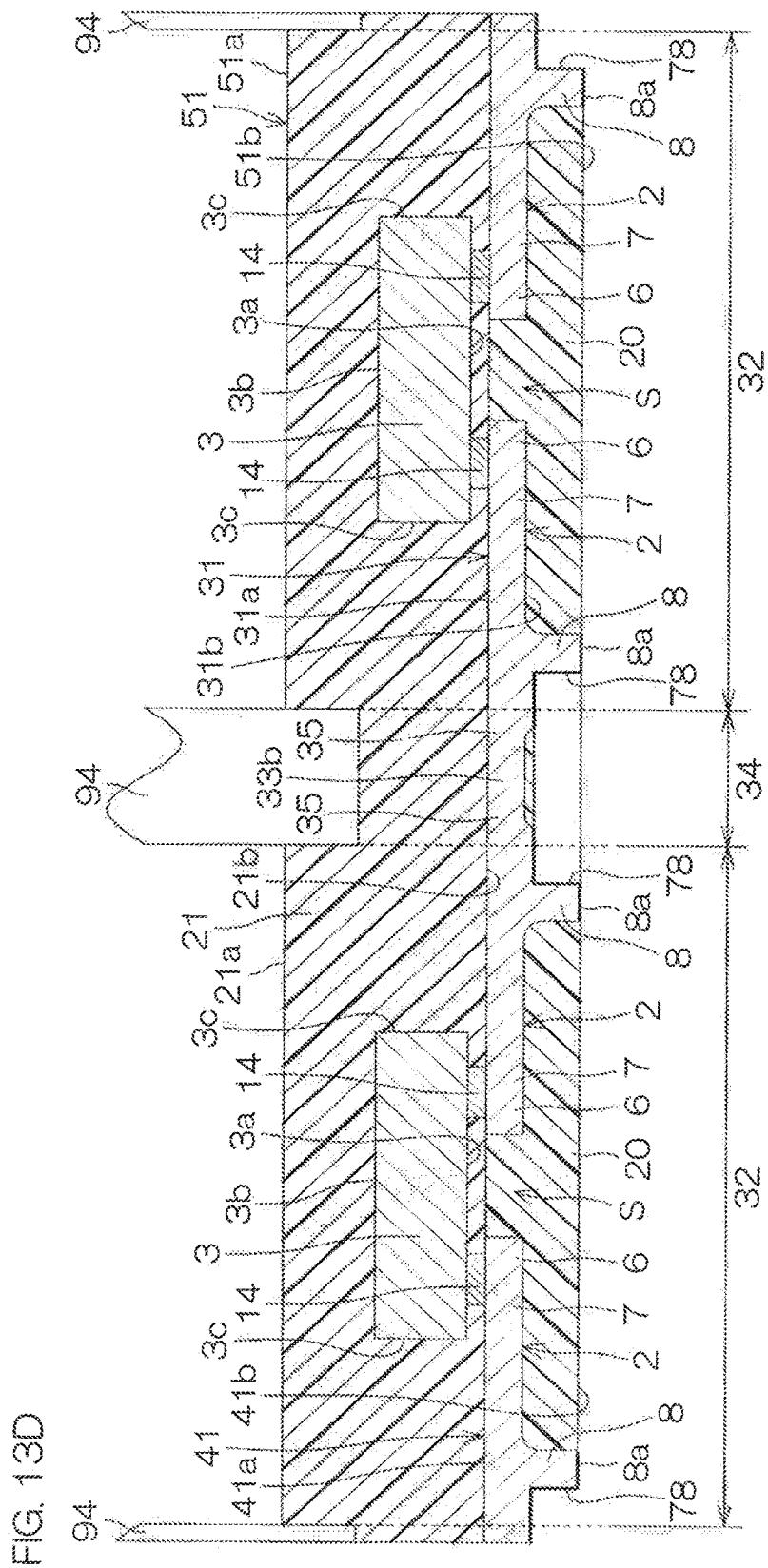

Next, referring to FIG. 13D, the sealing structure 51 is cut along the dicing region 34, for example, by a dicing blade 94. The dicing blade 94 has a grinding width substantially equal to the width of the dicing region 34. In other words, the dicing blade 94 has a grinding width narrower than the width of the dicing blade 92 described above. Therefore, the semiconductor device 71 that has the lead cutout portion 72 in each lead connecting portion 8 and the resin cutout portion 75 in the first sealing resin 20 is diced out. In this way, the semiconductor device 71 is manufactured.

As described above, according to the semiconductor device 71 of this embodiment, the contact area between the conductive bonding material (for example solder) and each lead connecting portion 8 can be increased by the lead notched portion 72 formed in each lead connecting portion 8.

Further, when the semiconductor device 71 is mounted onto a mounting substrate, the conductive bonding material (for example solder) can be brought into contact with both the first step 73 and the second step 74 of each lead connecting portion 8. Thereby, the adhesion between each lead connecting portion 8 and the conductive bonding material (for example solder) can be enhanced. Further, the mounting strength of the semiconductor device 71 to the mounting substrate can be enhanced.

Fourth Embodiment

Figure 14:
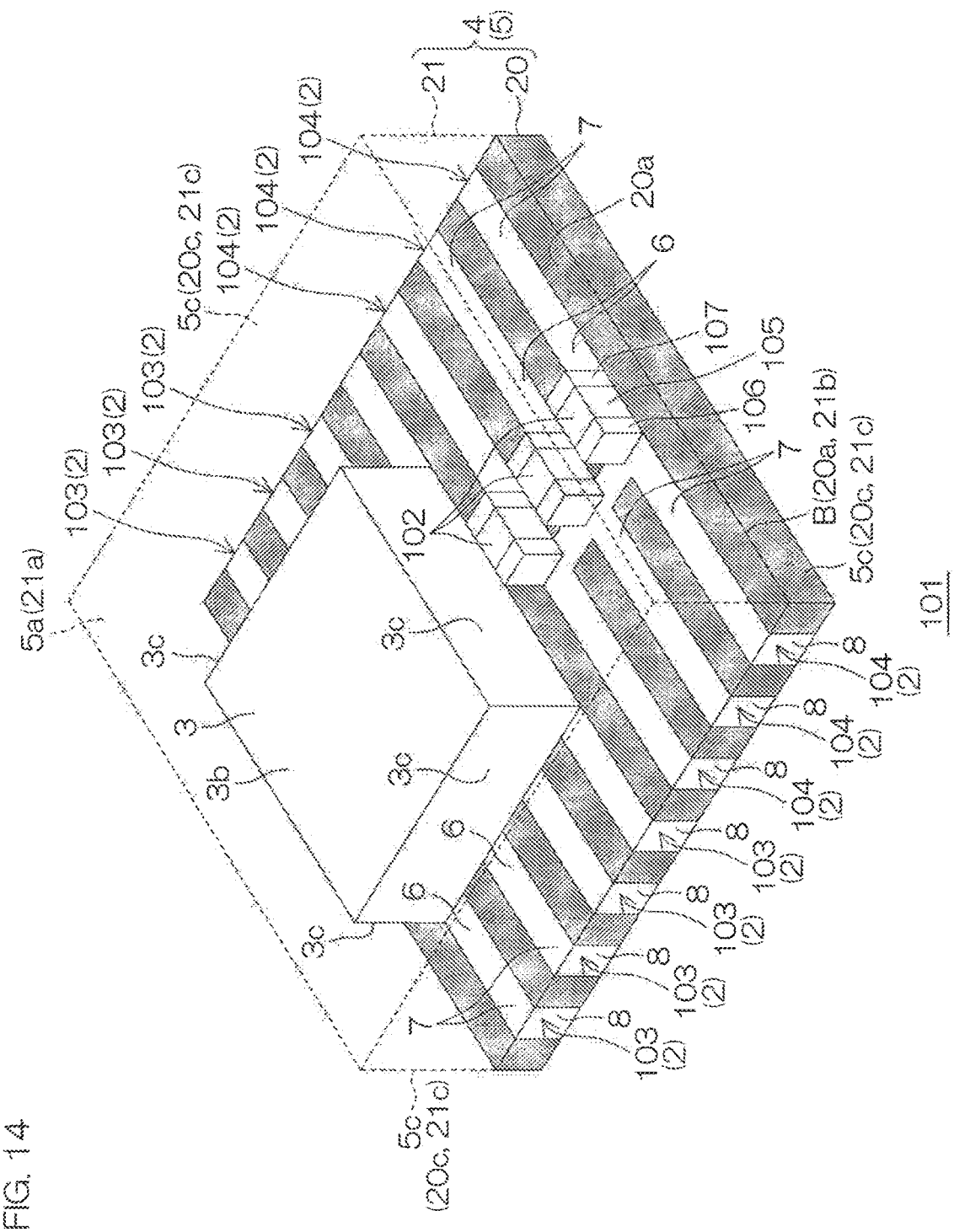
FIG. 14 is a perspective view of a semiconductor device according to a fourth embodiment of the present invention as viewed from an upper surface side.
Figure 15:
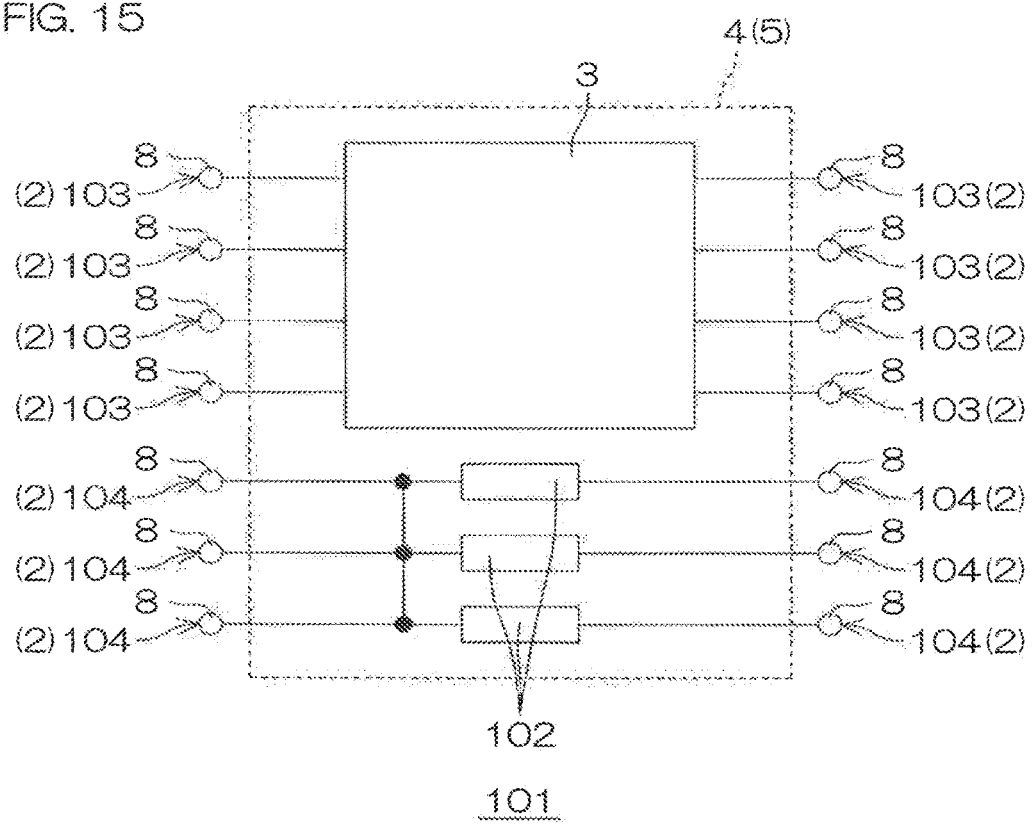
FIG. 15 is a schematic circuit diagram showing an electrical structure of the semiconductor device shown in FIG. 14.

FIG. 14 is a perspective view of a semiconductor device 101 according to a fourth embodiment of the present invention as viewed from upper surface side. FIG. 15 is a schematic circuit diagram showing an electrical structure of the semiconductor device 101 shown in FIG. 14. The first sealing resin 20 is shown cross-hatched in FIG. 14 for the sake of clarity. Further, the second sealing resin 21 is shown in broken lines in FIG. 14 for the sake of clarity.

The semiconductor device 101 according to the fourth embodiment is a composite semiconductor device wherein one semiconductor chip 3 and a plurality of (three in this embodiment) chip parts 102 are co-packaged. In FIG. 14 and FIG. 15, the same reference numerals are applied to the same structures as those described in the first embodiment, and description thereof is omitted.

Referring to FIG. 14 and FIG. 15, in this embodiment, the plurality of leads 2 includes the same number of leads (seven leads in this embodiment) arranged respectively on one side and the other side of a pair of mutually opposing lateral surfaces 5c of the semiconductor package body 5.

Each of the plurality of leads 2 includes the previously-described lead body portion 7 and the lead connecting portion 8. Further, the plurality of leads 2 includes a plurality of first leads 103 whereon the semiconductor chip 3 is bonded, and a plurality of second leads 104 whereon the chip parts 102 are bonded.

The plurality of first leads 103 includes the same number of leads (four leads in this embodiment) arranged spaced apart from each other respectively on one side and the other side of a pair of mutually opposing lateral surfaces 5c of the semiconductor package body 5. The plurality of second leads 104 includes the same number of leads (three leads in this embodiment) arranged spaced apart from each other respectively on one side and the other side of a pair of mutually opposing lateral surfaces 5c of the semiconductor package body 5.

Referring to FIG. 15, the three second leads 104 arranged on one lateral surface 5c of the semiconductor package body 5 may be set to the same electric potential (for example ground electric potential). Each mounting portion 6 of the second lead 104 that has the same electric potential may be integrally formed.

Each chip part 102 is a minute electronic component referred to as a 0603 (0.6 mm×0.3 mm) chip, a 0402 (0.4 mm×0.2 mm) chip, a 03015 (0.3 mm×0.15 mm) chip and the like.

Each chip part 102 has a functional element, and includes a functional element body 105 that forms a chip body, and a first external terminal 106 and a second external terminal 107 electrically connected to the functional element.

The functional element body 105 has a rectangular parallelopiped shape. The functional element body 105 may include an insulating material such as ceramic, glass ($SiO_2$), and an organic resin. The functional element body 105 may include a semiconductor material such as silicon. The functional element may include a resistor, a capacitor, a coil, a fuse or a diode.

The first external terminal 106 is formed on one end of the functional element body 105. The second external terminal 107 is formed on the other end of the functional element body 105. In each chip part 102, the first external terminal 106 and the second external terminal 107 are bonded onto the mounting portions of a corresponding lead 2 via a conductive bonding material (for example solder).

More specifically, the first external terminal 106 of each chip part 102 is bonded onto the mounting portion 6 of the corresponding second lead 104 arranged on one lateral surface 5c of the semiconductor package body 5 via the conductive bonding material (for example solder). Further the second external terminal 107 of each chip part 102 is bonded onto the mounting portion 6 of a corresponding second lead 104 arranged on the other lateral surface 5c of the semiconductor package body 5 via the conductive bonding material (for example solder).

The first sealing resin 20 seals the plurality of leads 2 that includes the plurality of first leads 103 and the plurality of second leads 104 in the same manner as the first embodiment. The second sealing resin 21 seals the plurality of leads 2 that includes the plurality of first leads 103 and the plurality of second leads 104, the semiconductor chip 3, and the plurality of chip parts 102 in the same manner as the first embodiment.

The semiconductor device 101 according to this embodiment can be manufactured by changing the layout of the lead frame 31 according to the first embodiment.

For example, in the step shown in the previously-described FIG. 7A, the lead frame 31 wherein the plurality of leads 2 that includes the first lead 103 and the second lead 104 is retained by the frame member 33 via the support portion 35 is prepared.

Then, in the step shown in the previously-described FIG. 7E, the step of mounting the chip part 102 onto the second lead 104 is added in addition to the step of mounting the semiconductor chip 3 onto the first lead 3. In this way, the semiconductor device 101 can be manufactured.

The same effect as those described in the first embodiment can also be achieved by the semiconductor device 101 according to this embodiment.

Further the semiconductor chip 3 can be bonded on the lead frame intermediate body 41. Therefore, the semiconductor chip 3 can be favorably bonded onto the plurality of first leads 103. Thereby, the semiconductor device 101 wherein the electrical connection between the semiconductor chip 3 and the plurality of first leads 103 is favorably achieved can be provided in high yield.

Further, in the semiconductor device 101 according to this embodiment, the plurality of chip parts 102 can be bonded onto the lead frame intermediate body 41 in addition to the semiconductor chip 3. Therefore, the plurality of chip parts 102 can be bonded onto the plurality of second leads 104. Thereby, the semiconductor device 101 wherein the electrical connection between the plurality of chip parts 102 and the plurality of second leads 104 is favorably achieved can be provided in high yield.

It is also possible to combine the structure of the fourth embodiment with the structure of the second embodiment or the third embodiment.

Fifth Embodiment

Figure 16:
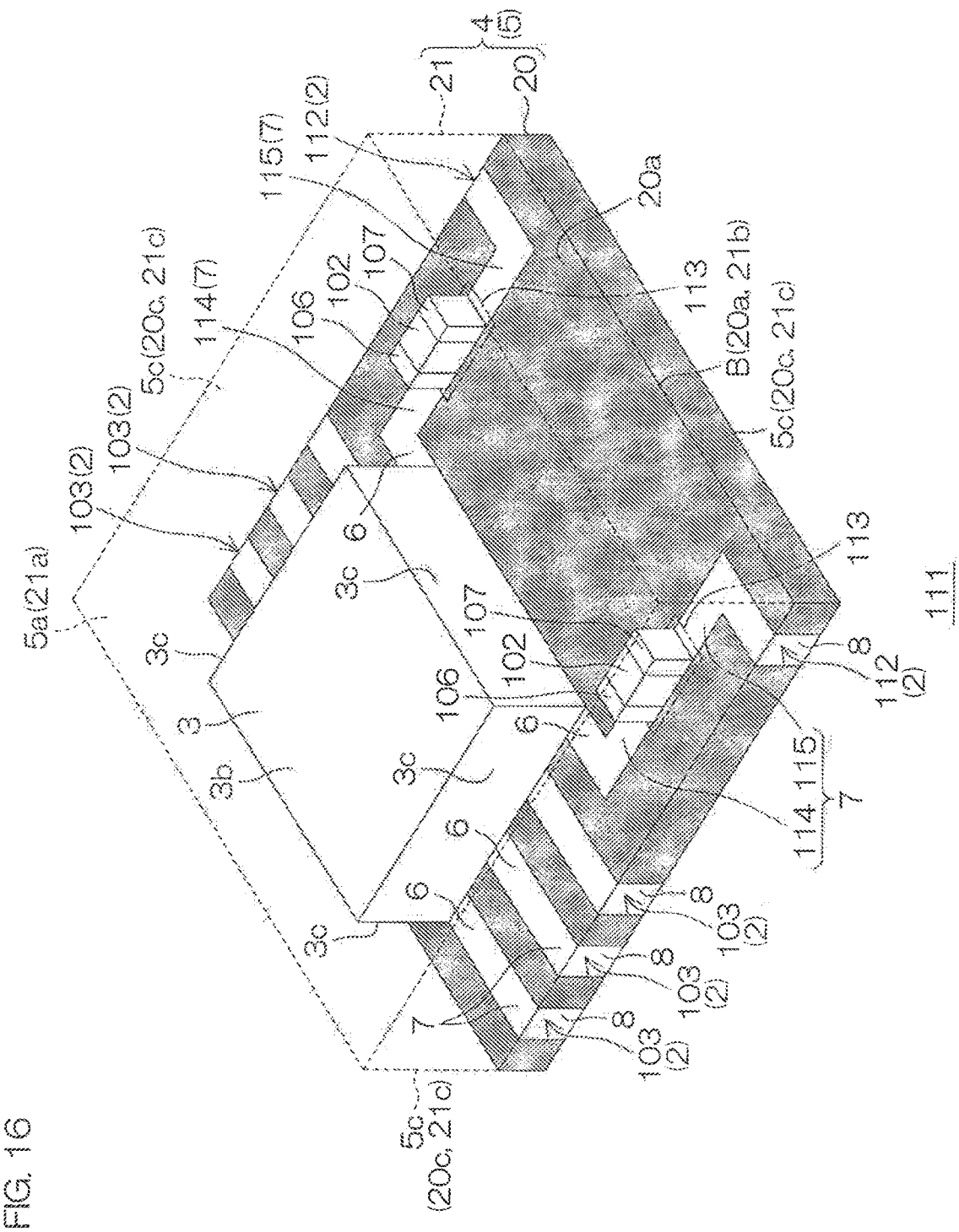
FIG. 16 is a perspective view of a semiconductor device according to a fifth embodiment of the present invention as viewed from an upper surface side.
Figure 17:
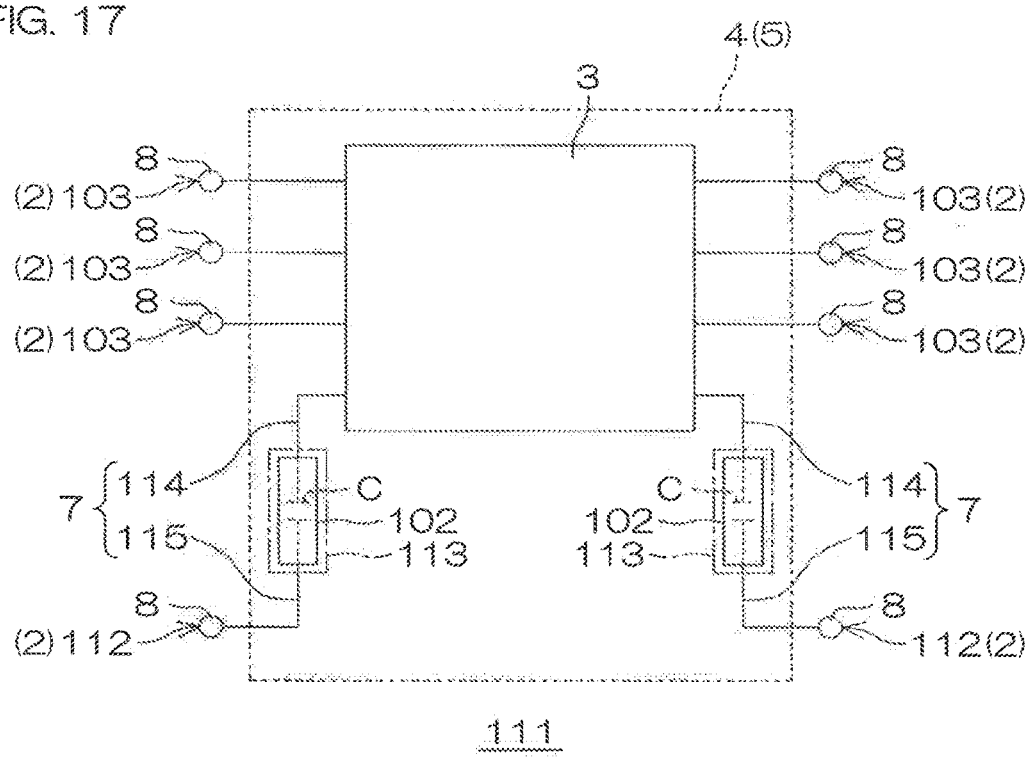
FIG. 17 is a schematic circuit diagram showing an electrical structure of the semiconductor device shown in FIG. 16.

FIG. 16 is a perspective view of a semiconductor device 111 according to a fifth embodiment of the present invention as viewed from an upper surface side. FIG. 17 is a schematic circuit diagram showing an electrical structure of the semiconductor device 111 shown in FIG. 16. The first sealing resin 20 is shown cross-hatched in FIG. 16 for the sake of clarity. Further, the second sealing resin 21 is shown in broken lines in FIG. 16 for the sake of clarity.

The semiconductor device 111 according to the fifth embodiment is a composite semiconductor device wherein one semiconductor chip 3 and a plurality of (two in this embodiment) chip parts 102 are co-packaged. In FIG. 16 and FIG. 17, the same reference numerals are applied to the same structures as those described in the fourth embodiment, and the description thereof is omitted.

Referring to FIG. 16 and FIG. 17, in this embodiment, the plurality of leads 2 includes the same number of leads (four leads in this embodiment) arranged respectively on one side and the other side of a pair of mutually opposing lateral surfaces 5c of the semiconductor package body 5.

The plurality of leads 2 includes the plurality of first leads 103 and a plurality of second leads 112. The semiconductor chip 3 is bonded onto the plurality of first leads 103. The chip part 102 is bonded onto the plurality of second leads 112.

The plurality of first leads 103 includes the same number of leads (three leads in this embodiment) arranged spaced apart from each other respectively on one side and the other side of a pair of mutually opposing lateral surfaces 5c of the semiconductor package body 5. The plurality of second leads 112 includes the same number of leads (one lead in this embodiment) arranged respectively on one side and the other side of a pair of mutually opposing lateral surfaces 5c of the semiconductor package body 5.

Each lead body portion 7 of the plurality of leads 112 has a mounting region 113 which includes an upper surface whereon the chip part 102 is bonded. The plurality of second leads 112 is divided into a first connection region 114 and a second connection region 115 in the mounting region 113. The first connection region 114 and the second connection region 115 are opposed to each other with the first sealing resin 20 interposed therebetween and are electrically insulated from each other.

The first connection region 114 includes the mounting portion 6 whereon the first external terminal 106 of the chip part 102 and the semiconductor chip 3 are bonded. The second connection region 115 includes the lead connecting portion 8. The second connection region 115 includes the mounting portion 6 whereon the second external terminal 107 of the chip part 102 is bonded.

The first external terminal 106 of each chip part 102 is bonded on the first connection region 114 of the corresponding second lead 112 via a conductive bonding material (for example solder). The second external terminal 107 of each chip part 102 is bonded on the second connection region 115 of the corresponding second lead 112 via a conductive bonding material (for example solder).

Therefore, each chip part 102 is bonded on the corresponding second lead 112 with the first connection region 114 and the second connection region 115 in a state of being bridged.

Referring to FIG. 17, the chip part 102 is connected between the semiconductor chip 3 and the lead connecting portion 8. According to this embodiment, the chip part 102 includes a capacitor C as a functional element. The capacitor C enables the application of a stable voltage to the semiconductor chip 3.

The same effect as those described in the fourth embodiment can also be achieved by the semiconductor device 111 according to this embodiment. It is also possible to combine the semiconductor device 111 according to this embodiment with the structure of the second embodiment or the third embodiment.

Sixth Embodiment

Figure 18:
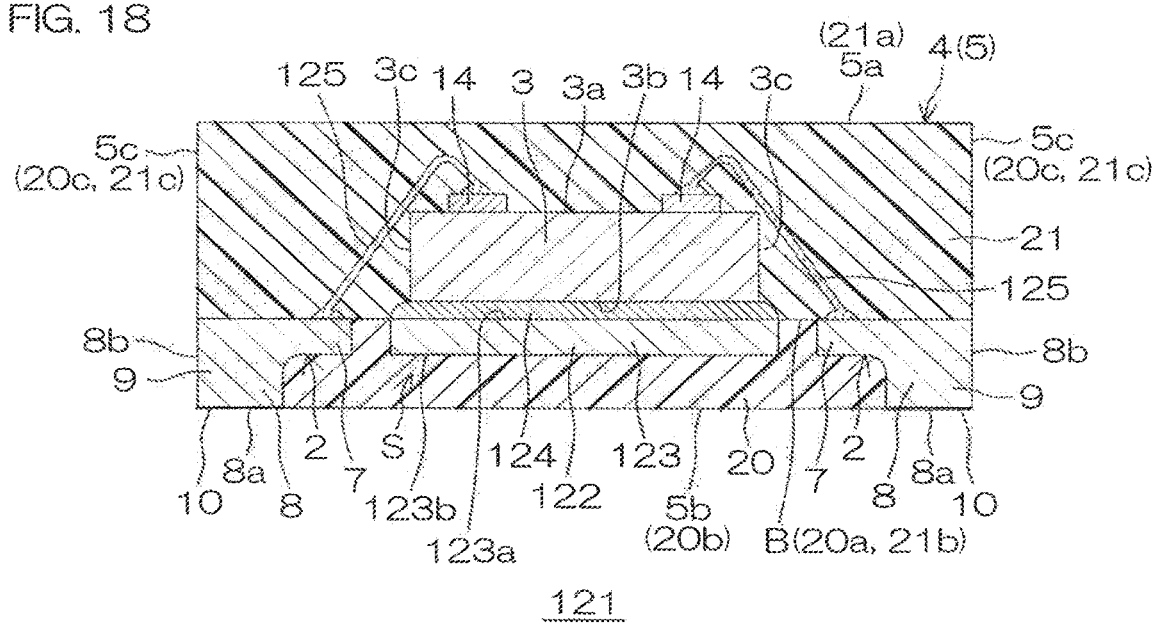
FIG. 18 is a cross-sectional view showing the semiconductor device according to a sixth embodiment of the present invention.

FIG. 18 is a cross-sectional view showing the semiconductor device 121 according to a sixth embodiment of the present invention. In FIG. 18, the same reference numerals are applied to the same structures as those described in the first embodiment, and the description thereof is omitted.

A semiconductor device 121 includes a die pad 123 which has a mounting portion 122 which has an upper surface whereon the semiconductor chip 3 is mounted, the plurality of leads 2 which is arranged around the die pad 123 and electrically connected to the semiconductor chip 3, and the sealing resin 4 which seals the semiconductor chip 3, the plurality of leads 2, and the die pad 123.

The plurality of leads 2 has substantially the same structures as those shown in the first embodiment except that the lead body portion 7 does not have the mounting portion 6. Therefore, in this embodiment, the die pad 123 that has the mounting portion 122 is formed in place of the lead body portion 7 that has the mounting portion 6.

The die pad 123 has, for example, a rectangular shape in plan view. The die pad 123 is formed of the same material as the material of the plurality of leads 2. The die pad 123 has an upper surface 123a and a lower surface 123b. In this embodiment, the space S is defined by the lower surface 123b of the die pad 123 in addition to the lower surface of each lead body portion 7 and each lead connecting portion 8 of the plurality of leads 2.

The semiconductor chip 3 is arranged on the upper surface 123a of the die pad 123 in a posture where the first main surface 3a faces upward. The second main surface 3b of the semiconductor chip 3 is bonded on the upper surface 123a of the die pad 123 via a bonding material 124.

The bonding material 124 may be a conductive bonding material or an insulation bonding material. The electrode pad 14 of the semiconductor chip 3 is electrically connected to a corresponding lead 2 via a conductive wire 125. In this embodiment, the conductive wire 125 is a bonding wire (for example copper wire). The conductive wire 125 may be a conductive plate (for example copper plate) in place of the bonding wire.

The sealing resin 4 includes the first sealing resin 20 and the second sealing resin 21. The first sealing resin 20 seals the space S below the lower surface 123b of the die pad 123. The first sealing resin 20 expose the lower surface 8a of each lead connecting portion 8, and exposes the second lateral wall 8b of each lead connecting portion 8 that is positioned outside the space S.

The second sealing resin 21 seals the semiconductor chip 3 above the upper surface 123a of the die pad 123. The second sealing resin 21 seals the first main surface 3a and the lateral surface 3c of the semiconductor chip 3 above the upper surface of each lead body portion 7 and above the upper surface 123a of the die pad 123.

The boundary portion B where the upper surface 20a of the first sealing resin 20 and the lower surface 21b of the second sealing resin 21 are in contact with each other is positioned in a region between the second main surface 3b of the semiconductor chip 3 and the lower surface 123b of the die pad 123. The boundary portion B is positioned substantially on the same plane as the upper surface of each lead body portion 7 and the upper surface 123a of the die pad 123. Therefore, the upper surface 20a of the first sealing resin 20 and the lower surface 21b of the second sealing resin 21 are also positioned substantially on the same plane as the upper surface of each lead body portion 7 and the upper surface 123a of the die pad 123.

The semiconductor device 121 according to this embodiment can be manufactured by changing the layout of the lead frame 31 according to the first embodiment. For example, in the step shown in FIG. 7A, the lead frame 31 in which the die pad 123 and the plurality of leads 2 are retained by the frame member 33 via the support portion 35 are prepared. Then, the semiconductor device 121 can be manufactured by performing the same steps as those shown in FIGS. 7B through 7H.

In this way, even if the semiconductor device 121 has a structure that includes the die pad 123 that has the mounting portion 122 in place of the lead body portion 7 that has the mounting portion 6, can achieve the same effect as the effect described in the first embodiment.

It is also possible to combine the semiconductor device 121 according to this embodiment with the structure of the second embodiment or third embodiment.

Seventh Embodiment

Figure 19:
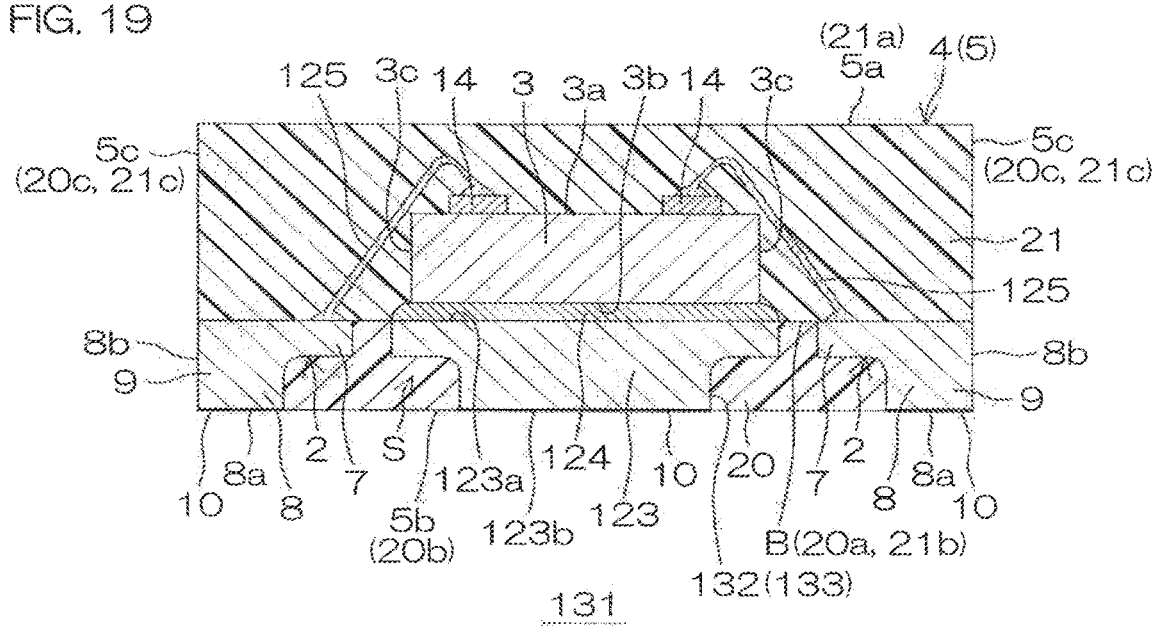
FIG. 19 is a cross-sectional view showing the semiconductor device according to a seventh embodiment of the present invention.

FIG. 19 is a cross-sectional view showing a semiconductor device 131 according to a seventh embodiment of the present invention. In FIG. 19, the same reference numerals are applied to the same structures as those described in the sixth embodiment, and the description thereof is omitted.

The semiconductor device 131 according to this embodiment has a structure wherein the lower surface 123b of the die pad 123 is exposed from the first sealing resin 20. A locking portion 132 is formed in the die pad 123.

More specifically, a recessed portion 133 recessed inward is formed as the locking portion 132 in the lateral surface of the die pad 123. The die pad 123 is prevented from falling off from the first sealing resin 20 by the recessed portion 133 filled with the first sealing resin 20. The lower surface 123b of the die pad 123 may be formed by the plated layer 10.

Even with such a structure, it is possible to achieve the same effect as the effect described in the first embodiment. Further, since the lower surface 123b of the die pad 123 is exposed from the first sealing resin 20, the heat generated from the semiconductor chip 3 can be favorably dissipated to the outside. Therefore, it is possible to provide the semiconductor device 131 that has an excellent heat dissipation.

Other Embodiments

Although the embodiments according to the present invention are described as above, the present invention may be put into practice in other embodiments.

In each previously-described embodiment, an example wherein the lead frame intermediated body 41 is formed by using the first mold 39 for transfer molding, is described. However, the lead frame intermediate body 41 may be formed by using the first mold 39 for compression molding.

In each previously-described embodiment, an example wherein the sealing structure 51 is formed by using the second mold 44 for transfer molding, is described. However, the sealing structure 51 may be formed by using the second mold 44 for compression molding.

In each previously-described embodiment, a surface roughening treatment may be applied to the upper surface 31a and the lower surface 31b of the lead frame 31 (see also FIG. 6). The surface roughening treatment may be applied by wet etching or dry etching.

According to the lead frame 31 subjected to surface roughening treatment, the adhesion between the lead frame 31 and the first sealing resin 20 can be enhanced. Further, the adhesion between the lead frame 31 and the second sealing resin 21 can also be enhanced.

It is to be understood that variations and modifications can be made within the scope of matters described in claims.

This application corresponds to Patent Application No. 2016-026107 submitted to Japanese Patent Office on Feb. 15, 2016, and the entire contents of the application is hereby incorporated by reference.

Although the embodiments according to the present invention have been detailed as above, these embodiments are merely examples to clarify the technical subject matter of the present invention, and thus the present invention should not be limited to these embodiments, and the scope of the present invention, therefore, is to be determined solely by the following claims.

What is claimed is:

1. A semiconductor device comprising:
    leads each includes a lead body portion having an upper surface as a chip mount portion and a lower surface, a lead connecting portion having a lower surface for external connection, the lower surface projects downward from the lower surface of the lead body portion, and an inner connecting portion defined between the lead connecting portion and the lower surface of the lead body portion and having a curved shape;
    a first sealing resin that is formed below the lead body portions and in contact with both of the inner connecting portion and the lead connecting portion;
    a semiconductor chip that includes electrode pads electrically connected to corresponding upper surfaces of the lead body portions and that has a facing surface facing to the upper surfaces of the lead body portions and the upper surface of the first sealing resin; and
    a second sealing resin that enters into a region between the upper surface of the first sealing resin and the semiconductor chip, and that seals the upper surfaces of the leads, the upper surface of the first sealing resin and the semiconductor chip on the lead body portions, and that forms a boundary surface with the upper surfaces of the lead body portions and the upper surface of the first sealing resin; and
    wherein the lower surface of each lead connecting portion of the leads is exposed from the lower surface of the first sealing resin.

2. The semiconductor device according to claim 1, wherein the second sealing resin includes a same resin material as the resin material of the first sealing resin.

3. The semiconductor device according to claim 1, wherein the first sealing resin has a side surface, and the second sealing resin has a side surface formed flush with the side surface of the first sealing resin.

4. The semiconductor device according to claim 3, wherein the side surface of the first sealing resin is a grinding surface, and the side surface of the second sealing resin is a grinding surface.

5. The semiconductor device according to claim 1, wherein the electrode pads of the semiconductor chip face the first sealing resin with the lead body portions located between the electrode pads and the first sealing resin.

6. The semiconductor device according to claim 1, wherein the electrode pads of the semiconductor chip are connected only to the upper surfaces of the lead body portions.

7. The semiconductor device according to claim 1, wherein the lead connecting portions each includes a base portion projecting downward from the lower surface of the lead body portion, and a plated layer formed on the base portion and forming the lower surface of the lead connecting portion, the inner connecting portions of the leads each connects the lead body portion and the base portion of the lead connecting portions, and the first sealing resin covers the base portions and the plated layers inside the space defined by the leads.

8. The semiconductor device according to claim 7, wherein the lead connecting portions each has a side surface formed by the base portion and the plated layer.

9. The semiconductor device according to claim 8,
wherein the plated layer exposes a portion forming the side surface of the lead connecting portion in the base portion.

10. The semiconductor device according to claim 8,
wherein the first sealing resin has side surfaces exposing the side surfaces of the lead connecting portions.

11. The semiconductor device according to claim 10,
wherein the side surfaces of the first sealing resin are formed flush with the side surfaces of the lead connecting portions.

12. The semiconductor device according to claim 7,
wherein the first sealing resin has a lower surface that exposes the plated layers of the lead connecting portions.

13. The semiconductor device according to claim 12,
wherein the lower surface of the first sealing resin is formed flush with the plated layers of the lead connecting portions.

14. The semiconductor device according to claim 7,
wherein the plated layers each has a laminated structure including an Ni layer, a Pd layer, and an Au layer laminated in this order on the base portion, and
the first sealing resin has a lower surface exposing the Au layers of the plated layers.

15. The semiconductor device according to claim 14,
wherein the lower surface of the first sealing resin is formed flush with the Au layers of the plated layers.

16. The semiconductor device according to claim 1,
wherein the leads each includes a lead notched portion notching a corner portion at an opposite side to the space in a lower surface of the lead connecting portion in a step shape.

17. The semiconductor device according to claim 16,
wherein the lead notched portions each has an outer corner portion having a curvature lower than a curvature of the inner connecting portion of the leads.

18. The semiconductor device according to claim 17,
wherein the outer corner portions of the lead notched portions are angularly formed.

19. The semiconductor device according to claim 16, further comprising:
notched plated layers covering wall surfaces of the lead notched portions.

20. The conductor device according to claim 19,
wherein the notched plated layers each covers the lower surface of the lead connecting portion and expose a lateral wall of the lead connecting portion.

21. The semiconductor device according to claim 20,
wherein the first sealing resin has side surfaces exposing the side surfaces of the lead connecting portions.

22. The semiconductor device according to claim 21,
wherein the side surfaces of the first sealing resin are formed flush with the side surfaces of the lead connecting portions.

23. The semiconductor device according to claim 16,
wherein the first sealing resin includes a resin notched portion notching a corner portion of a lower surface of the first sealing resin in a step shape and communicating with the lead notched portions of the leads.

24. The semiconductor device according to claim 1,
wherein, the leads each includes a thin portion formed by the lead body portion and a thick portion formed by the lead body portion and the lead connecting portion,
the first sealing resin supports the thin portions from directly below the thin portions in the space defined by the leads, and
the semiconductor chip is arranged only on the thin portions of the leads.

25. The semiconductor device according to claim 24,
wherein the semiconductor chip does not overlap with the thick portions of the leads as viewed in plan.

26. The semiconductor device according to claim 1, further comprising:
a chip part that includes a chip body having a functional element and external terminals formed on the chip body and connected to corresponding upper surfaces of the lead body portions of the leads.

27. The semiconductor device according to claim 26,
wherein the leads include first leads and second leads,
the electrode pads of the semiconductor chip are connected to the upper surfaces of the lead body portions of the first leads, and
the external terminals of the chip part are connected to the upper surfaces of the lead body portions of the second leads.

28. The semiconductor device according to claim 26,
wherein only the first sealing resin is placed in an area directly below the chip part in the space defined by the leads, and
the lower surface of the first sealing resin is overlapped with an entire region of a surface of the chip part as viewed in plan.

29. The semiconductor device according to claim 1,
wherein the lead connecting portion includes a base portion projecting downward from the lower surface of the lead body portion,
the inner connecting portion of the lead connects the lead body portion and the base portion of the lead connecting portion, and
the first sealing resin is in contact with a side surface of the base portion.

30. The semiconductor device according to claim 29,
wherein the first sealing resin surrounds the base portion.

31. The semiconductor device according to claim 30, further comprising:
a plated layer that is formed on a lower surface of the base portion.

32. The semiconductor device according to claim 31, further comprising:
a plated layer that is formed on the side surface of the base portion.

* * * * *